(12) United States Patent
Satoh et al.

(10) Patent No.: US 6,188,074 B1
(45) Date of Patent: Feb. 13, 2001

(54) CHARGED PARTICLE BEAM EXPOSURE APPARATUS

(75) Inventors: Takamasa Satoh; Soichiro Arai, both of Tokyo (JP)

(73) Assignee: Advantest Corporation, Tokyo (JP)

(*) Notice: Under 35 U.S.C. 154(b), the term of this patent shall be extended for 0 days.

(21) Appl. No.: 09/209,377

(22) Filed: Dec. 10, 1998

(30) Foreign Application Priority Data

Dec. 10, 1997 (JP) .................................................. 9-340281
Dec. 25, 1997 (JP) .................................................. 9-356959

(51) Int. Cl.[7] .................................................. H01J 37/302
(52) U.S. Cl. .................................. 250/492.22; 250/492.2
(58) Field of Search ........................... 250/492.22, 492.2, 250/398, 505.1

(56) References Cited

U.S. PATENT DOCUMENTS 5,260,579  11/1993  Yasuda et al. ..................... 250/492.2
5,841,145 * 11/1998  Satoh et al. ..................... 250/492.22
5,910,658 *  6/1999  Arai et al. ....................... 250/492.22

* cited by examiner

Primary Examiner—Kiet T. Nguyen
(74) Attorney, Agent, or Firm—Christie, Parker & Hale, LLP

(57) ABSTRACT

A charged particle beam exposure apparatus of the BAA type is disclosed, which improves the transmission rate of at least a signal transmission path leading from a blanking aperture array (BAA) control circuit to at least a blanking electrode and has an increased BAA driving speed. The impedance of the signal transmission path leading from the driver of the BAA control circuit to the BAA electrode is rendered to coincide with the output impedance of the driver of the BAA control circuit. Further, an auxiliary transmission path is provided for leading the signal transmission path inside a column outside of the column, and terminates with a resistor having the same impedance with the transmission impedance, thereby matching the impedance of the signal transmission path.

22 Claims, 17 Drawing Sheets

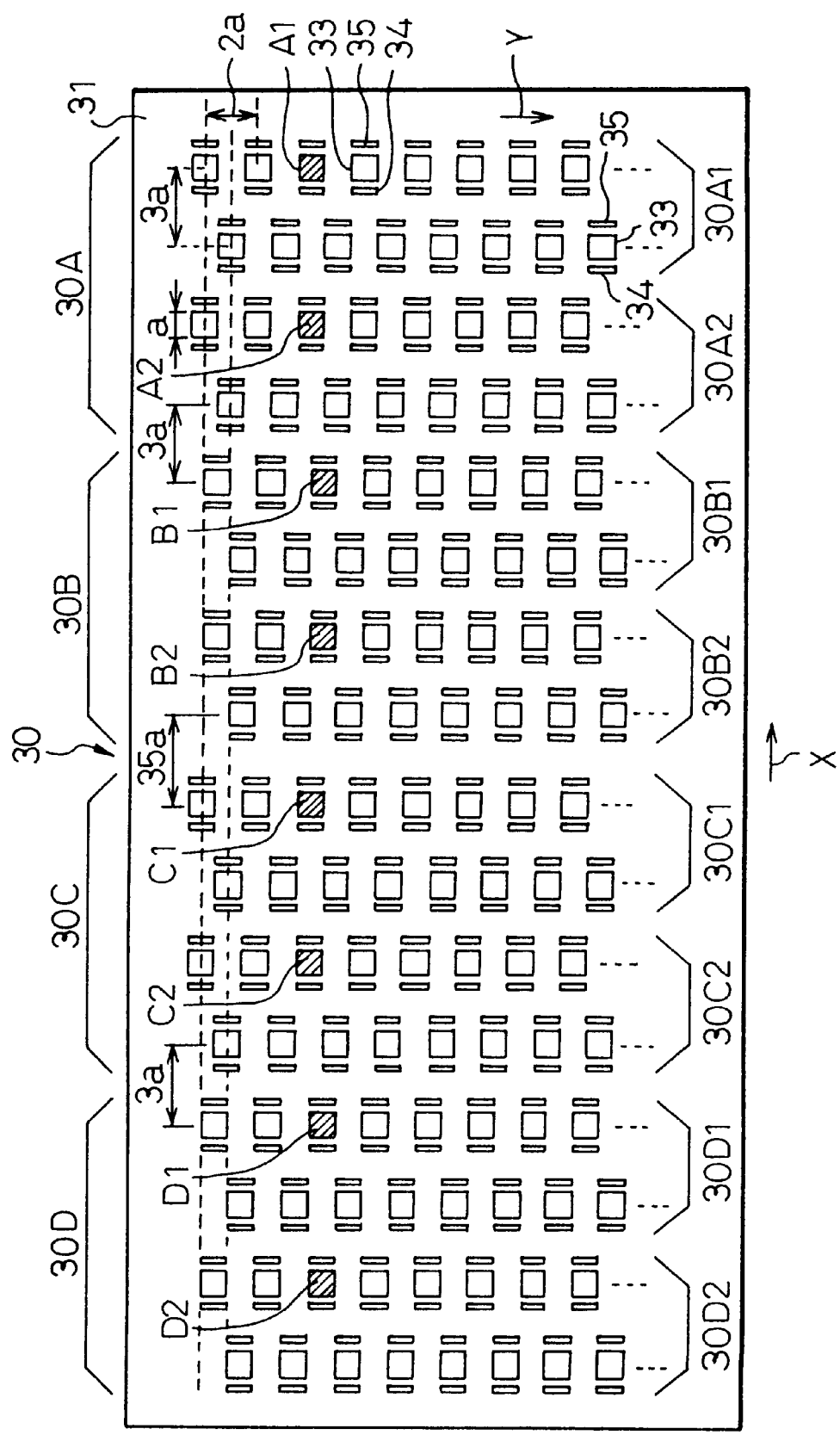

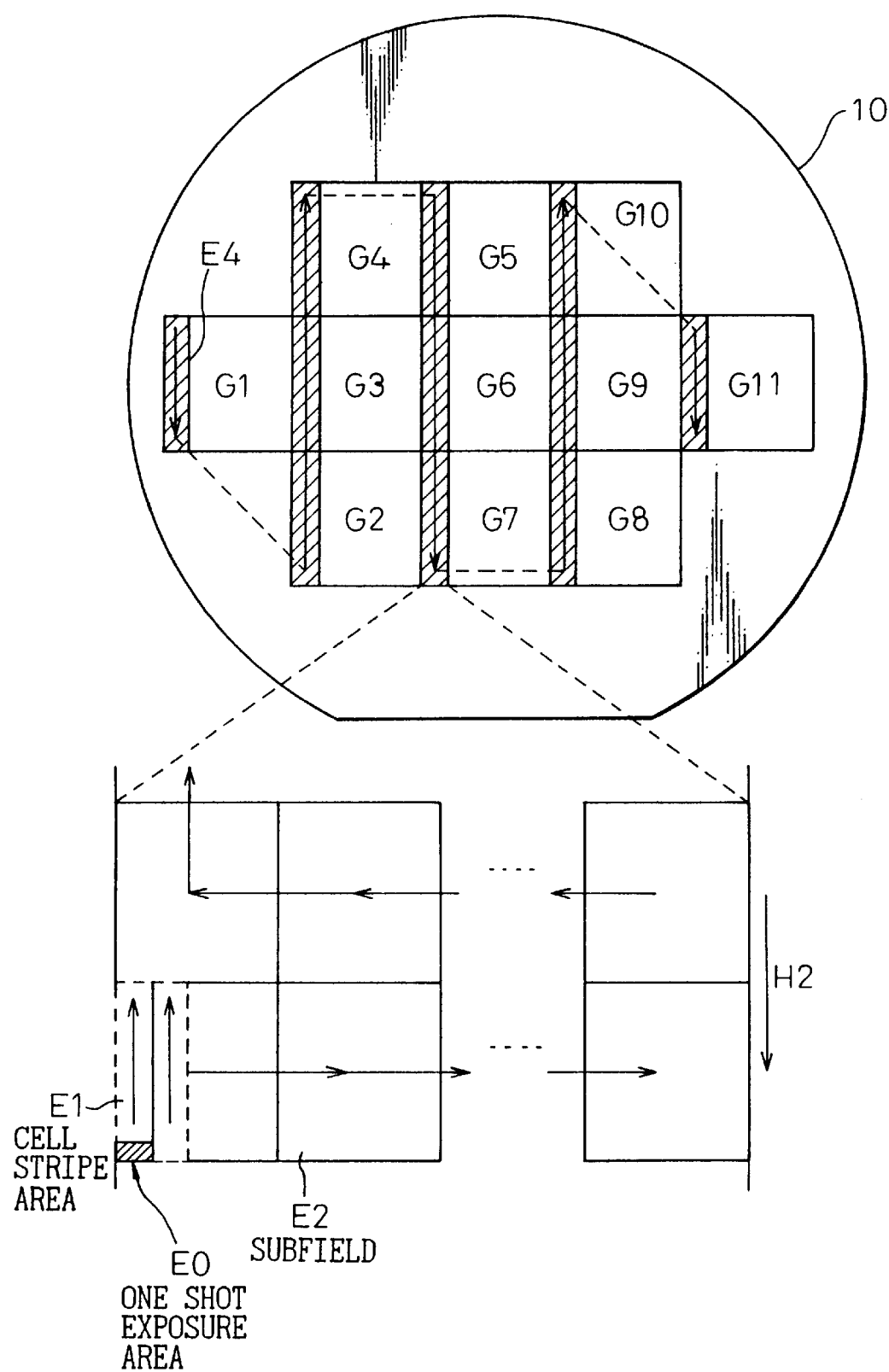

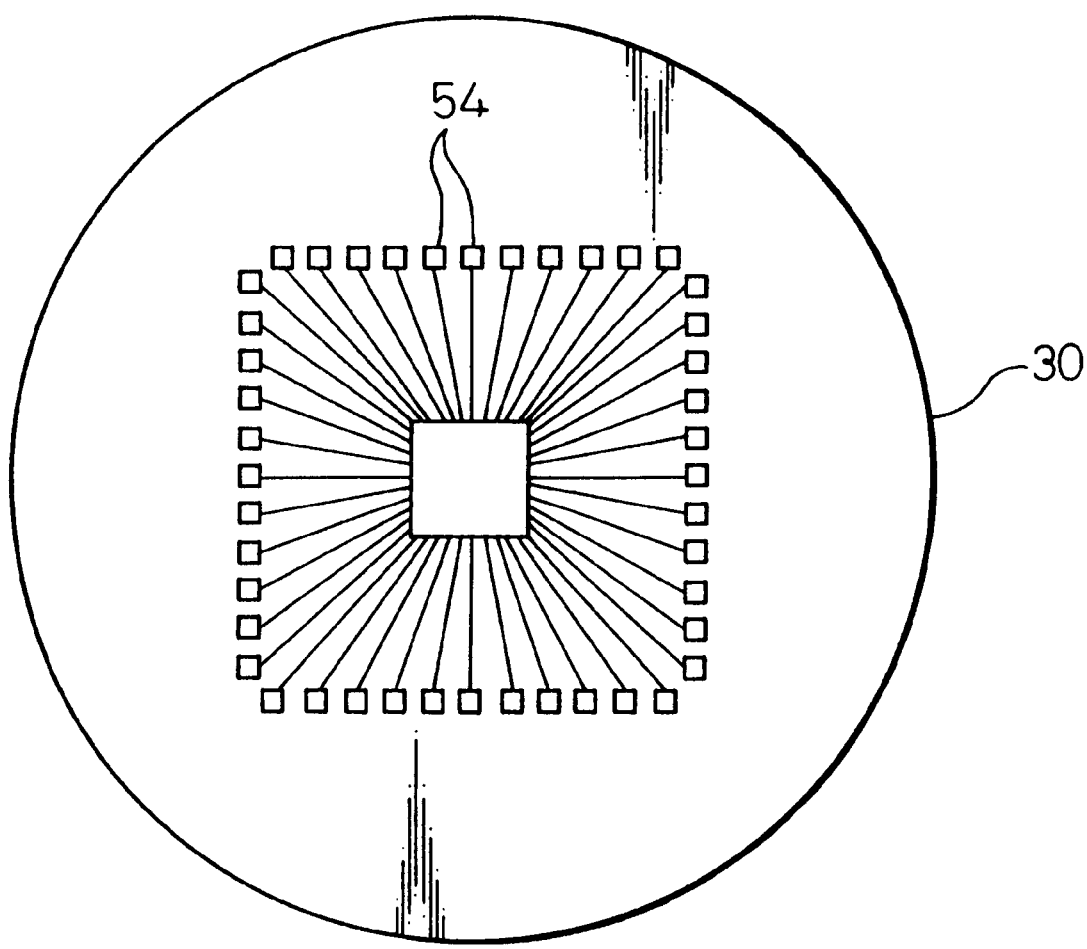

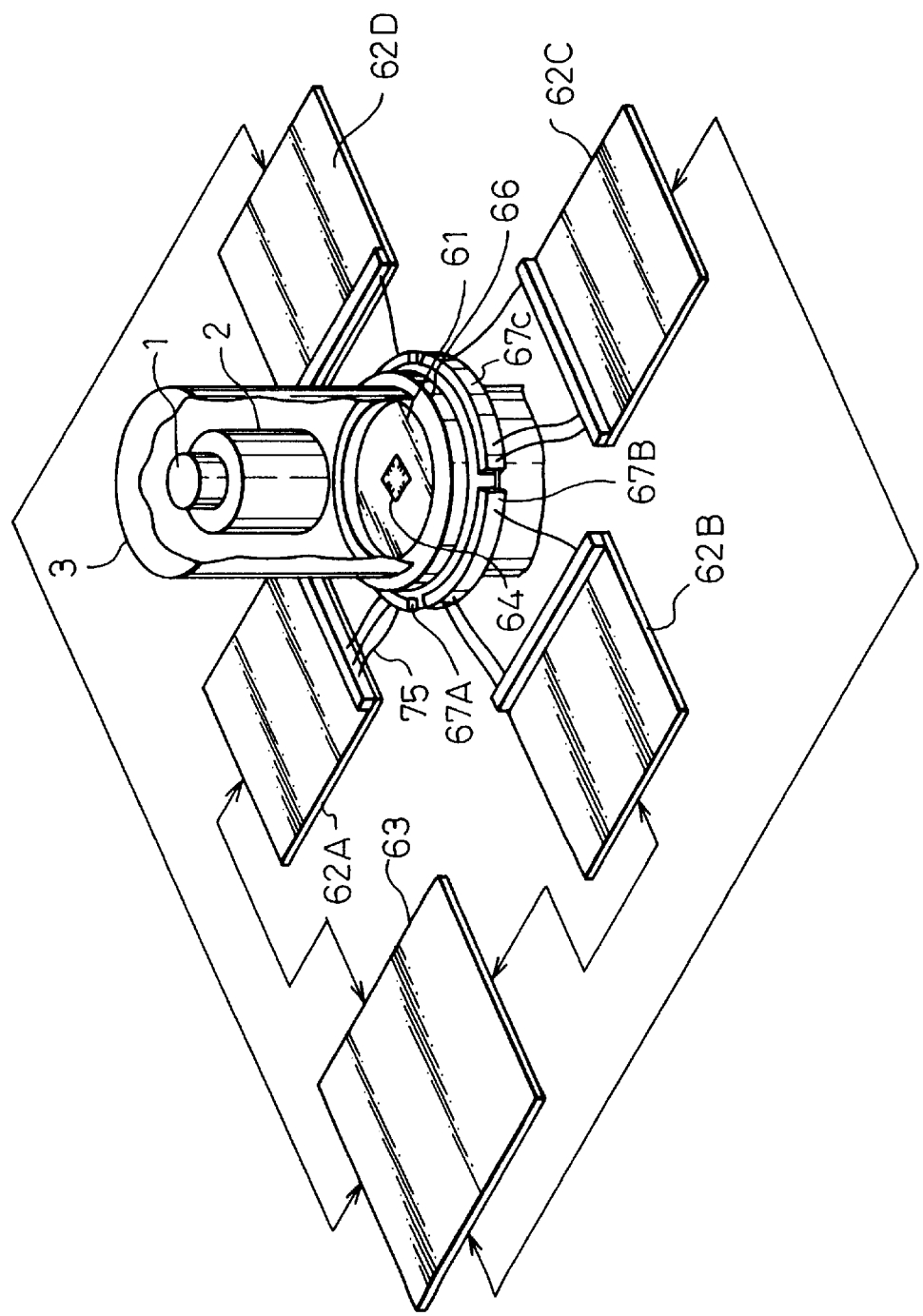

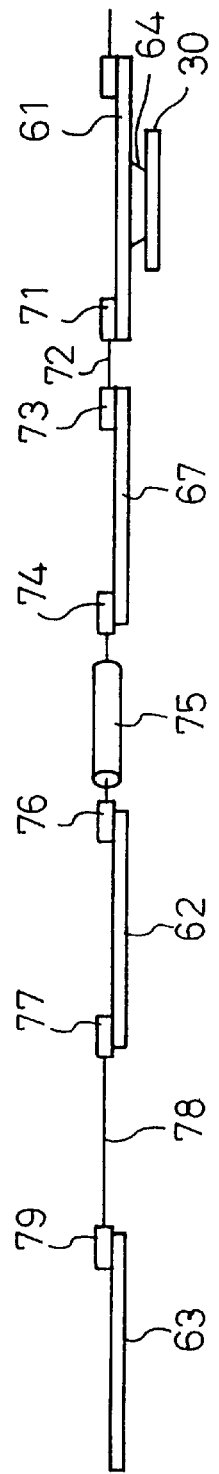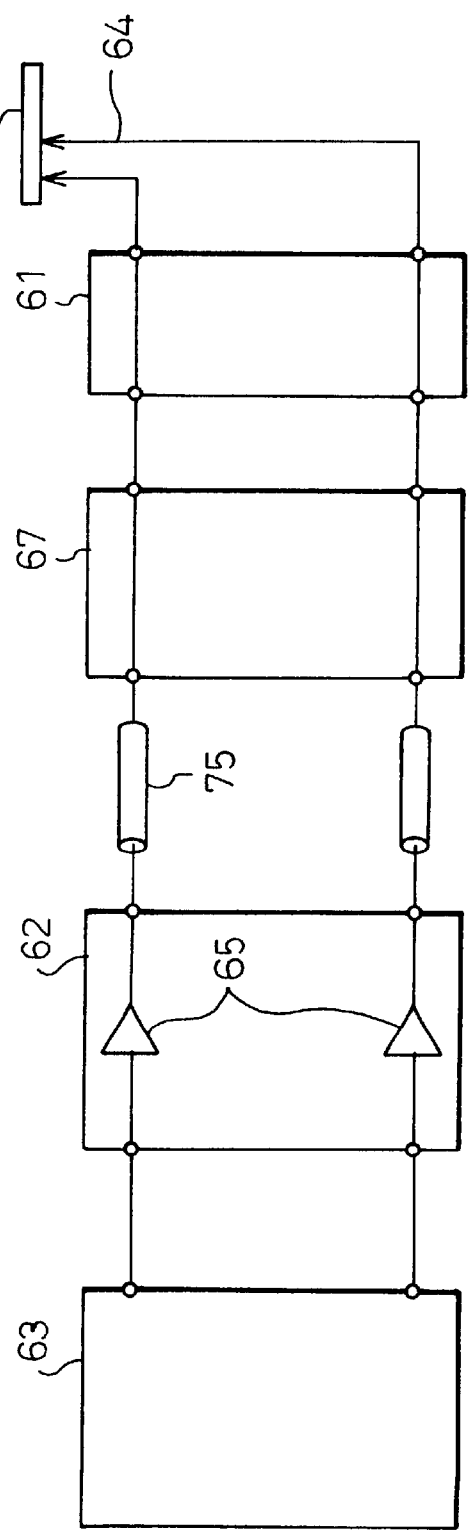

CHARGED PARTICLE BEAM EXPOSURE APPARATUS

BACKGROUND OF THE INVENTION

The present invention relates to a charged particle beam exposure apparatus, or more in particular to a charged particle beam exposure apparatus utilizing a blanking aperture array (BAA).

In recent years, semiconductor technology has advanced and the integrity and the function of the semiconductor integrated circuits (IC) have improved to such an extent that the technology in this field is expected to play the central role in the technological development of the whole computer, communication and machine control industries. There is a general trend that the density of ICs increases by about four times every three years. The storage capacity of the dynamic random access memory (DRAM), for example, has increased from 4M to 16M to 64M to 256M and to 1 G. This ever-increasing integration of the LSI depends to a large measure on advances in micromachining technology in the semiconductor manufacturing process.

Under the circumstances, the limit of micromachining technology is defined by the pattern exposure technique. As a technique for exposing a pattern, an optical exposure apparatus called a stepper is currently used. In an optical exposure apparatus, the minimum width of the pattern that can be formed is defined by the wavelength of an exposure light source due to diffraction. A light source which outputs ultraviolet light is currently used, and it has become increasingly difficult to use the light of a shorter wavelength. For achieving a finer micromachining technology, a new exposure method other than the optical exposure apparatus has been under study.

The charged particle beam exposure is known as a means which can realize the micromachining of not more than 0.05 $\mu$m with a positioning accuracy of not more than 0.02 $\mu$m. In the prior art, however, the charged particle beam exposure has been considered difficult to use for mass production of LSIs because of its low throughput as compared with the stepper.

The throughput problem now encountered in the charged particle beam exposure is a result of using single-stroke electron beam exposures to produce continuous scans by a single particle beam (electron beam), for example, but it is not the result of a sincere study, based on the analysis of the probable cause of the physical and technological bottlenecks, to improve the throughput. Specifically, the prevailing judgment that the charged particle beam exposure cannot be used for mass production of LSIs due to a low throughput is nothing but a consideration from the viewpoint of productivity of the apparatuses now available on the market.

On the other hand, an application of the block exposure or the multi-beam exposure using the blanking aperture array (BAA) has recently reached the stage where a charged particle beam exposure apparatus having a throughput of about 1 cm2/sec may be realized. Especially, the multi-beam exposure using the BAA, though somewhat inferior in accuracy to the block exposure, has the advantage that exposure of a high throughput is possible regardless of the shape and density of a pattern. This invention relates to a charged particle exposure apparatus of a multi-beam type using the BAA. In the description that follows, the charged particle beam exposure apparatus of multi-beam type using the BAA will be sometimes referred to simply as the BAA exposure apparatus. A detailed configuration of the BAA exposure apparatus is disclosed in U.S. Pat. No. 5,260,579, etc.

For the plotting speed to be increased for the BAA exposure apparatus, the BAA driving speed for on/off control of the beams is required to be increased. For this purpose, it is necessary to increase the transmission rate in the signal transmission path from the BAA control circuit to each blanking electrode of BAA. The signal transmission path from the BAA control circuit to each blanking electrode of BAA has an open terminal, and therefore substantially no current flows in the transmission path. For this reason, in the signal transmission path for applying the voltage signal output from the BAA control circuit to each blanking electrode, the voltage signal is transmitted without regard to the impedance. Further, the signal transmission path from the BAA control circuit to the blanking electrodes is considerably long. In the conventional transmission path, therefore, the signal cannot be easily transmitted at high speed, and the BAA driving speed is limited by the transmission rate in the signal transmission path. For increasing the BAA drive speed, therefore, the transmission rate is required to be increased in the signal transmission path from the BAA control circuit to each blanking electrode.

An electron beam is radiated from an electron gun to the BAA board. The electron beam is a flow of high-voltage (the voltage of the electron gun) charge, and the signal transmission path to each blanking electrode is charged to high voltage by the electron beam radiated. The current generated by the radiation of the electron beam is as minute as several $\mu$A, while the voltage sometimes assumes a value as high as several tens of KV. As long as a voltage is applied by the driver of the BAA drive circuit to the signal transmission path, therefore, the particular voltage is maintained. In the case where the driver is turned off or the signal transmission path is open midway and no driver is connected, on the other hand, the signal transmission path increases to so high a voltage that the charge moves (migrates) transiently between the signal transmission paths proximate to each other or between a signal transmission path and a DC-level power line connected to a common electrode, thereby often developing a dielectric breakdown in a short time. The apparatuses currently in use have a circuit board in the signal transmission path from the driver to the blanking electrodes, and the signal transmission paths approach each other most closely in the circuit board. Therefore, a board resistant to the migration is used, constituting one of the causes of an increased cost.

Further, when the signal transmission path increases in voltage as a result of electron beam radiation, the driver is supplied with a high voltage, often posing the problem of the breakdown of the driver. A similar phenomenon occurs in the case where the signal transmission path which is open due to the insufficient contact of the connector or the like is reconnected.

As described above, the BAA charged particle beam exposure apparatus with BAA arranged in the path of the charged particle (electron) beam has the problem that the radiation of a charged particle beam on the BAA applies a high voltage to the signal transmission path leading to the apertures of the BAA, thereby breaking the signal transmission path and the driver.

With the electron beam exposure apparatus of BAA type, it is absolutely necessary that individual apertures operate accurately to secure an accurate exposure pattern. In view of the fact that a connection board and a probe card are arranged in the route from the board carrying the BAA drive circuit to the BAA board and these boards are connected by connectors or a cable, however, the signal transmission path is liable to open, leading to a considerably high failure rate.

Further, there are as many signal transmission paths as BAA apertures in the signal transmission path leading from the board carrying the BAA drive circuit to the BAA board. The defect probability of the great number of signal transmission paths is multiplied by the number of the channels thereof. For improving the utilization rate of the apparatus, therefore, it is critical to check regularly whether a defect has occurred or not and to pinpoint a defective portion and repair any defect that has occurred.

A conceivable method of detecting a defect consists in detecting the voltage signal of the electrodes or the electrode pads of the BAA board directly. Since the BAA board is contained in a vacuum apparatus, however, it has hitherto been very difficult to detect the voltage signal by direct contact with the electrodes or the like. Especially during the exposure operation, the electrodes of the BAA board cannot be directly contacted. For detecting the occurrence of a defect in this method, therefore, the apparatus is required to be stopped provisionally at the sacrifice of a very low operating efficiency. Further, the measurement by direct contact with the electrodes has an effect of producing a state different from the state during the exposure, and therefore cannot be conducted accurately.

A method for detecting the electrode voltage without directly contacting the electrode is by using an electron beam probe. Since the BAA is so minute, however, direct detection with the electron beam probe has been difficult. This method also requires that the apparatus be stopped temporarily.

To overcome this problem, a probe having an electrode is arranged in place of a specimen, each electron beam is turned on selectively to detect the current flowing in the probe, and a beam with a different current amount is detected to detect a defective signal transmission path. This conventional method, however, involves so small a current amount per beam that a defective transmission path cannot be identified with sufficiently high accuracy.

For the reason described above, the actual practice of discovering a defective point has been to contact each point of the signal transmission path physically using a measuring instrument to check the conductive state. However, this has been a very troublesome job because of the great number of signal transmission paths.

In spite of a high probability of defect occurrence due to the long and multiplicity of signal transmission paths to the apertures of the BAA, the discovery of the occurrence of a defect and pinpointing a defective point has been difficult, especially during the exposure operation.

SUMMARY OF THE INVENTION

A first object of the present invention is to improve the transmission rate of the signal transmission paths from the BAA control circuit to the blanking electrodes and thereby to increase the BAA driving speed.

A second object of the invention is to reduce the occurrence of a defect in the signal transmission paths to the BAA apertures in a BAA exposure apparatus and to facilitate the detection of the occurrence of a defect and a defective point.

In order to realize the first object described above, according to a first aspect of the invention, there is provided a charged particle beam exposure apparatus in which the impedance of the signal transmission paths leading from the driver of the blanking aperture array (BAA) control circuit to the BAA electrodes is matched in such a way as to improve the transmission rate of the signal transmission paths. For matching the impedance of the signal transmission paths, the transmission impedance of the signal transmission paths is rendered to coincide with the output impedance of the driver of the BAA control circuit, and then the signal transmission paths are terminated with an impedance coinciding with the transmission impedance. For securing this termination, an auxiliary transmission path is provided for leading the signal transmission path inside the column outside of the column and is terminated with a resistor having the same impedance as the transmission impedance.

Specifically, a charged particle beam exposure apparatus according to the first aspect of the invention for forming a predetermined exposure pattern on a specimen using a charged particle beam, comprising a column with the inside thereof held in vacuum, charged particle beam generating means arranged in the column for generating a charged particle beam, a blanking aperture array arranged in the light path of the charged particle beam from the charged particle beam generating means in the column and including a two-dimensional arrangement of apertures for shaping the charge particle beam and a set of electrodes around each aperture for shaping the charged particle beam according to whether a voltage signal is applied to each electrode or not, a blanking aperture array control circuit arranged outside the column for outputting the voltage signal to be applied to the electrodes of each aperture according to the exposure pattern, and blanking aperture signal transmission paths extending from outside the column into the column and each including a plurality of channels for applying the voltage signal output from the blanking aperture array control circuit to the electrodes of each aperture, wherein the output impedance of the blanking aperture array control circuit substantially coincides with the transmission impedance of the blanking aperture signal transmission path, the apparatus further comprising an auxiliary transmission path including a plurality of channels extending from the electrodes of each aperture outside of the column, having a transmission impedance substantially coinciding with the transmission impedance, and terminating with an impedance substantially coinciding with the transmission impedance.

Specifically, a resistor having an impedance substantially equal to the transmission impedance is inserted at the terminal of the auxiliary transmission path.

In transmitting a signal, it is known that if the impedance is mismatched, the signal is deteriorated by being reflected at the mismatched portion and the transmission rate cannot be increased. For the transmission rate to be increased, therefore, it is necessary to match the impedance of the signal transmission path. In the conventional apparatuses, the signal transmission path has a transmission impedance coinciding with the output impedance of the driver of the BAA control circuit. However, the blanking electrodes of BAA are open and are not terminated with the same impedance. The reason is that the termination with the same impedance requires provision of resistors or the like of the same impedance. It is, however, difficult to secure a space for accommodating such a resistor in the neighborhood of each BAA blanking electrode. Also, if such a resistor is so provided, the optical system and the deflection means of the charged particle beam exposure apparatus are adversely affected by the heat generated in the resistor and the change in the heat amount so generated resulting in a reduced exposure accuracy. For this reason, in the conventional apparatuses, the impedance of the signal transmission paths is not matched and the transmission rate is limited due to the signal reflection occurring at the blanking electrodes.

The apparatus according to this invention, in contrast, further comprises an auxiliary transmission path for leading the signal transmission path in the column outside of the column. The signal transmission path is terminated at a resistor having the same impedance as the transmission impedance, and the impedance is matched in such as a way that the interior of the column is not affected by the heat generated by the terminal resistor. Therefore, the transmission rate of the signal transmission path can be increased, so that the BAA driving speed is improved for a higher plotting speed.

In the case where the column is connected to a power line at DC potential such as the ground, the terminal of the auxiliary transmission path may be the column.

A resistor generates a considerable amount of heat, and as many resistors as the signal transmission paths are required. The whole heat generated, therefore, is considerable. In addition, the amount of heat generated changes with the pattern for turning on the BAA beam. Even a small local temperature change affects the plotting accuracy of the charged particle beam exposure apparatus. Even when the terminal resistor is arranged outside the column, therefore, a temperature change with the amount of heat generated by the resistor adversely affects the apparatus. What affects the apparatus is the temperature change due to the change in the amount of heat. As long as the amount of heat generated is constant and in equilibrium, adjustment is possible to realize the optimum plotting under the prevailing condition. For the resistor arranged outside the column, therefore, the amount of heat generated is not a serious problem. In view of this, the apparatus further comprises a dummy driver for outputting a signal inverted from the output of the blanking aperture array control circuit, a dummy resistor arranged in the vicinity of the resistor, and a dummy transmission path having a plurality of channels for applying the voltage signal output from the dummy driver to the dummy resistor, wherein the resistor and the dummy resistor are thermally coupled to each other. By doing so, the change in the amount of heat generated is offset between the resistor and the dummy resistor, and therefore the amount of heat generated as a whole becomes constant. Thus, a superior plotting accuracy of the apparatus is maintained. From this viewpoint, the dummy driver desirably has an output impedance substantially coinciding with the blanking aperture array control circuit, the dummy transmission path desirably has a transmission impedance substantially coinciding with the first transmission impedance, and the dummy resistor desirably has an impedance substantially coinciding with the impedance of the resistor.

The resistor is desirably arranged at a distance from the column where the column interior is not thermally affected by the heat generated in the resistor.

The amount of heat generated by the resistor is considerable, and therefore means for cooling the resistor is desirably provided. Also, the BAA control circuit has a driver and an output resistor and is desirably cooled by cooling means.

In order to achieve the second object described above, according to a second aspect of the invention, there is provided a charged particle beam exposure apparatus further comprising a resistor inserted between the signal transmission path leading from the driver to the BAA electrodes and the power line of DC level such as the ground. With this resistor arrangement, the charge generated in the signal transmission path by the radiation of the charged particle beam on the BAA can be discharged to the power line of DC level. Therefore, the signal transmission path remains at a voltage level not high.

Specifically, the charged particle beam exposure apparatus according to the second aspect of the invention for forming a predetermined exposure pattern on a specimen using a charged particle beam, comprises charged particle beam generating means for generating a charged particle beam, a blanking aperture array arranged in the light path of the charged particle beam from the charged particle beam generating means and including a two-dimensional arrangement of a plurality of apertures and an electrode set around each aperture for shaping the charged particle beam according to whether a voltage signal is applied to each electrode or not, a blanking aperture array drive circuit for outputting the voltage signal to be applied to the electrodes of each aperture according to the exposure pattern, and a resistor inserted between the blanking aperture signal transmission path including a plurality of channels for applying the voltage signal output from the blanking aperture array drive circuit to the electrode of each aperture and a power line of predetermined DC level.

The resistance value of the resistor is determined by the potential generated in the signal transmission path by the radiation of the charged particle beam on the electrodes and a part of the signal transmission path and the dielectric breakdown voltage with respect to the surrounding of the signal transmission path. Further, the resistor operates as a protective circuit if configured so as to be opened or shorted in response to a voltage lower than the potential causing the dielectric breakdown in accordance with the dielectric breakdown voltage with the surrounding of the signal transmission path.

Further, a current monitor is inserted for detecting a current which flows in the power line of DC level through the resistor described above if a voltage is applied to the signal transmission path by the driver. As long as the portion of the signal transmission path to the point thereof connected with the resistor is open, no current flows in DC fashion. If the portion of the signal transmission path beyond the same point is open, on the other hand, a current flows in DC fashion. In that case, the open portion can be detected by driving the driver in DC fashion and detecting the DC current with the current monitor.

Especially, if a plurality of resistors are interposed between the power line of DC level and a plurality of points in the signal transmission path, the open portion can be specified in more detail since the DC current detected by the current monitor is varied from one open portion to another. In such a case, assume that the resistor is set to open at a potential lower than the potential at which the signal transmission path is subjected to dielectric breakdown. It is unknown whether the signal transmission path has opened or the resistor has opened. To obviate this inconvenience, the resistance values of a plurality of the resistors are differentiated, so that the current values are varied depending on the open state, and a defect can be identified from the difference in current value. Also, in the case where a signal transmission line includes a plurality of boards and means for connecting the boards, a resistor is desirably provided for each of a plurality of the resistors to protect against a defect often caused by the connects.

A current monitor can be provided for each signal transmission path or each of a plurality of signal transmission lines to connect a signal transmission line selectively to the current monitor by a relay associated with the particular signal transmission line.

Further, the apparatus preferably further comprises a defect detecting circuit in which the current value detected by each current monitor is detected at any time while being scanned chronologically, and when the detected current value is different from a predetermined value, a signal is output which indicates the occurrence of a defect and the channel where the defect has occurred.

BRIEF DESCRIPTION OF THE DRAWINGS

The present invention will be more clearly understood from the description as set below with reference to the accompanying drawings, wherein:

FIG. 4 is a diagram showing an example of a blanking aperture array;

FIG. 5 is a diagram for explaining the beam scanning in the charged particle beam exposure apparatus of FIG. 1;

FIG. 7 is a diagram showing an example of wiring on a blanking aperture array board;

FIG. 8 is a perspective view showing signal transmission paths from a BAA control circuit to BAA blanking electrodes;

FIGS. 9A and 9B are diagrams schematically showing a configuration of the signal transmission path leading from the BAA control circuit to the BAA blanking electrodes;

DESCRIPTION OF THE PREFERRED EMBODIMENTS

In the following description, a charged particle beam exposure apparatus of multi-beam type using BAA may be simply called the BAA exposure apparatus. Also, an electron beam exposure apparatus of BAA type using an electron beam as an example of the charged particle beam will be explained.

Further, before proceeding to a detailed description of the preferred embodiments, a conventional BAA type electron beam exposure apparatus will be described with reference to the accompanying drawings for a clearer understanding of the differences between the conventional art and the present invention.

Figure 1:
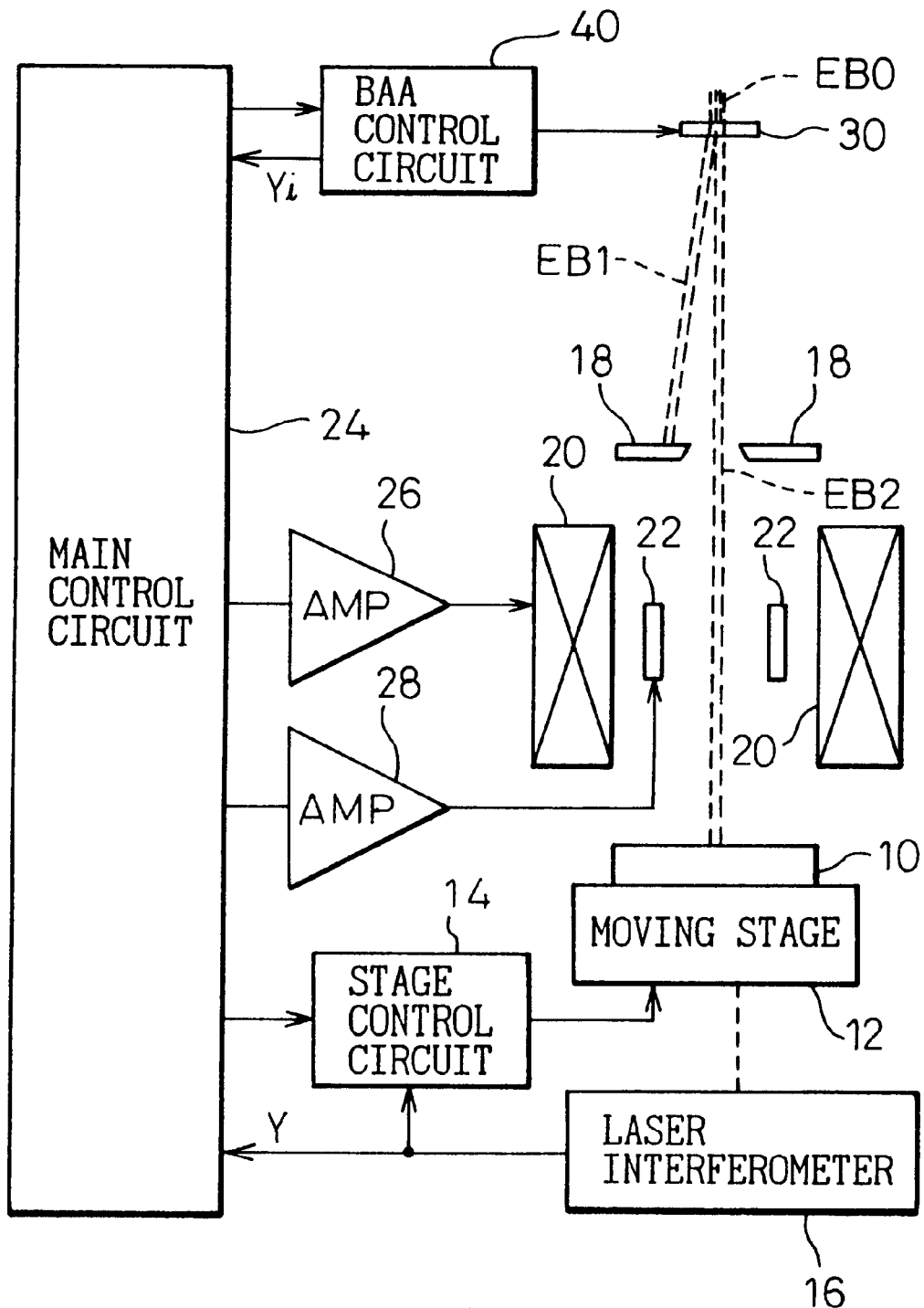
FIG. 1 is a block diagram showing an example of a configuration of a charged particle beam exposure apparatus according to the present invention.
Figure 2A:
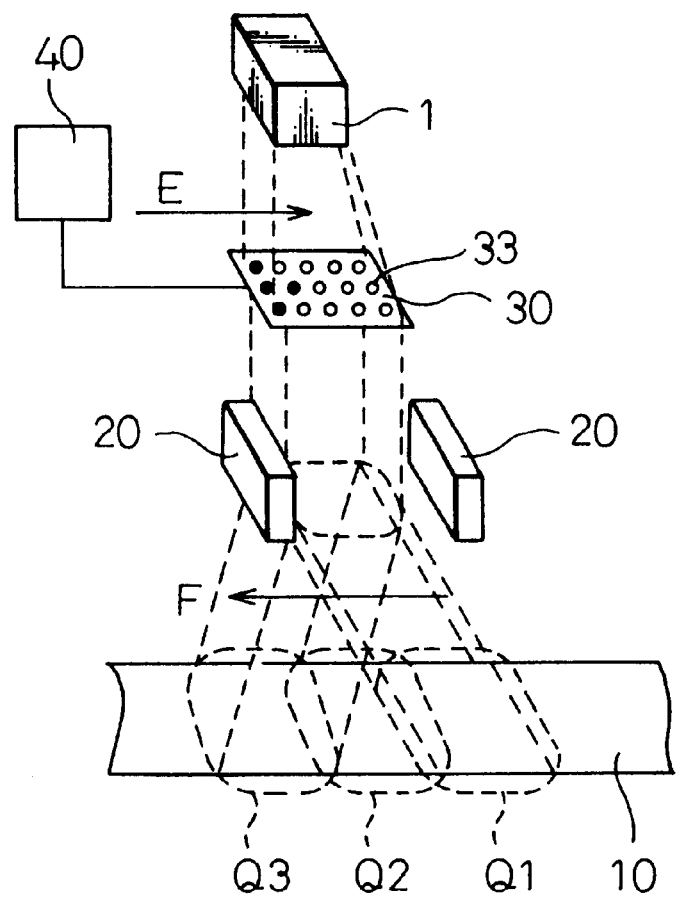
FIGS. 2A and 2B are diagrams (No. 1) for explaining the principle of exposure of the charged particle beam exposure apparatus of blanking aperture array (BAA) type.
Figure 2B:
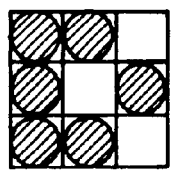

FIG. 1 is a block diagram schematically showing an example of the BAA exposure apparatus described above, represented by an electron beam exposure apparatus using an electron beam.

As shown in FIG. 1, a semiconductor wafer 10 making up an object of exposure (specimen) is placed on a moving stage 12, the movement of which is controlled by a stage control circuit 14. The position of the moving stage 12 is detected by a laser interferometer 16, and fed back to the stage control circuit 14 for controlling the movement of the stage 12. Also, a resist film is deposited on the semiconductor wafer 10. An electron beam EB2 generated by an electron gun (not shown) and formed into a beam bundle containing a multiplicity of beams through blanking apertures (BAA) 30 is radiated on the resist film through circular apertures of an aperture plate 18, thereby accomplishing the exposure by an electron beam.

The electron beam EB2 is scanned on the semiconductor wafer 10 by the moving stage 12, an electromagnetic main deflector 20 and an electrostatic subdeflector 22 arranged above the moving stage 12. The moving stage 12, the main deflector 20 and the subdeflector 22 are capable of scanning over a range in the descending order of size with the required accuracy, but in the ascending order of response speed.

The main control circuit 24 supplies a target position to the stage control circuit 14, supplies a periodical saw-toothed wave signal to an amplifier circuit 26, receives a stage detection position Y from the laser interferometer 16, and supplies a signal proportional to the subdeflection distance to an amplifier 28. The drive signals current-amplified and voltage-amplified by the amplifier circuits 26 and 28, respectively, are applied to the main deflector 20 and the subdeflector 22.

The electron beam is generated and exposure effected in a vacuum. Therefore, the electron gun, the BAA 30, the aperture plate 18, the main deflector 20, the subdeflector 22 and the moving stage 12 are incorporated in an evacuated optical lens barrel called the column.

FIGS. 2A, 2B and 3A to 3C are diagrams for explaining the principle of the BAA exposure method. With reference to these drawings, the BAA exposure method will be briefly explained.

The charged particle (electron) beam emitted from the electron gun 1 is assumed to pass through a plurality of apertures of the blanking aperture array 30 and scanned in the direction of arrow F on the specimen 10 by the electromagnetic main deflector 20 and the electrostatic subdeflector (not shown). Reference characters Q1 to Q3 designate a bundle of electron beams moving over the specimen 10.

In the blanking aperture array 30, on the other hand, a plurality of apertures 33 are arranged two-dimensionally. The electron beam is split into a plurality of beams as it passes through the blanking aperture array 30. The electron beam passing through each aperture can be turned on or off by applying or not applying a voltage, respectively, between the electrodes arranged on both sides of each aperture.

Specifically, when a voltage is applied between the electrodes, the electron beam that has passed through the aperture is deflected and follows a different track, while in the case where no voltage is applied between the electrodes, the electron beam that has passed through the aperture proceeds in the same direction as before. If the electron beam with the track thereof deflected is shielded by an iris, an electron beam bundle is obtained that has passed the apertures where no voltage is applied between the electrodes. In this way, the electron beam passing through each aperture can be turned on or off.

Figure 3A:
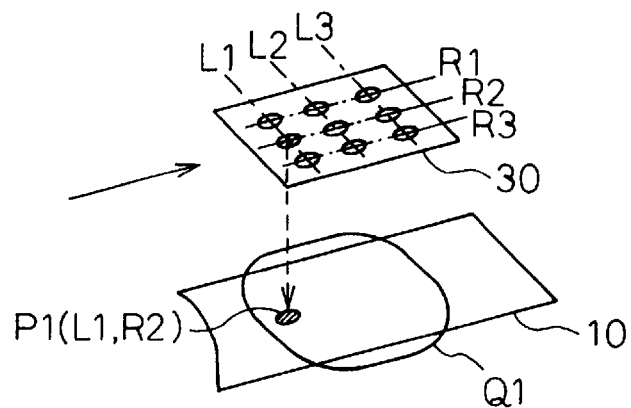
FIGS. 3A to 3C are diagrams (No. 2) for explaining the principle of exposure of the charged particle beam exposure apparatus of blanking aperture array (BAA) type.
Figure 3B:
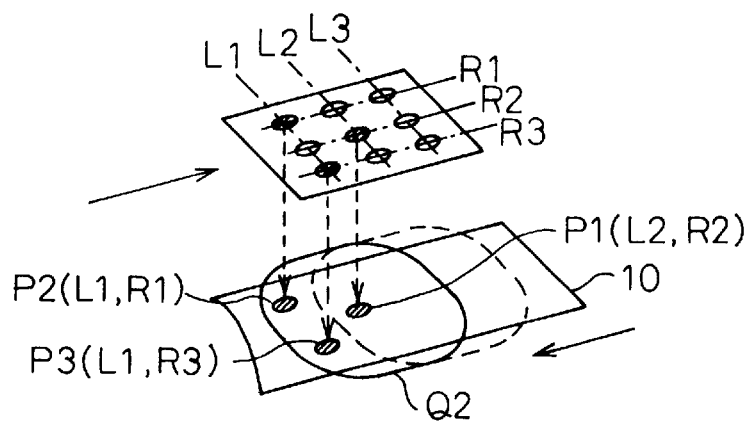
Figure 3C:
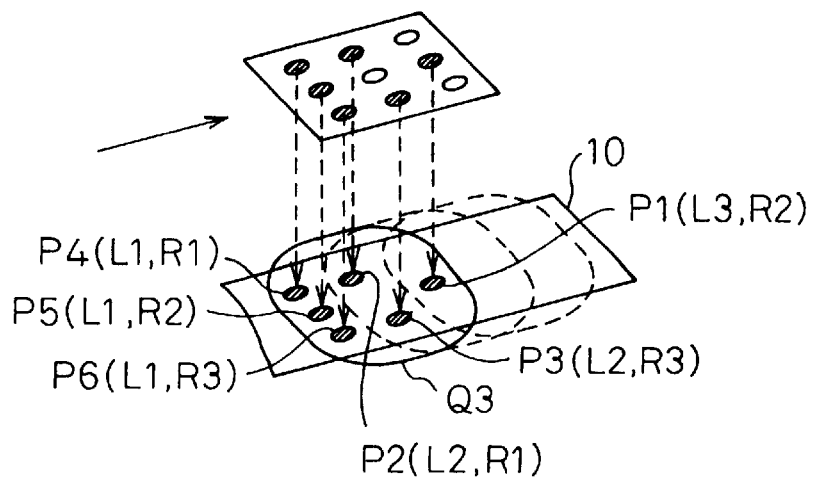

Now, consider the case of exposure using the blanking aperture array 30 of nine apertures configured of vertical three rows R1, R2, R3 by lateral three lines L1, L2, L3 as shown in FIGS. 3A to 3C. First, as shown in FIG. 3A, only the aperture of the leftmost line L1 by the center row R2 of the blanking aperture array 30 is turned on, and the other apertures are all turned off. Under this condition, deflection means 20, 22 deflect and radiate the electron beam at position Q1 on the specimen 10. Thus, the electron beam is radiated only at position P1 of the specimen 10.

Then, as shown in FIG. 3B, the exposure pattern is moved rightward by one line, and the aperture of center line L2 by center row R2 of the blanking aperture array 30 is turned on, the apertures of line L1 by rows R1 and R3 are turned on, and the remaining apertures are turned off. Under this condition, the deflection means 20 and 22, on the other hand, deflect and radiate the electron beam at position Q2 on the specimen 10. As a result, the electron beam that has passed through the aperture (L2, R2) is radiated again at position P1 of the specimen 10 exposed under the state of FIG. 3A. Further, the two electron beams that have passed through the apertures (L1, R1) and (L1, R3) are radiated newly at positions P2 and P3 on the specimen 10.

In the next step, as shown in FIG. 3C, the exposure pattern is moved further rightward by one line, the center row R2 of rightmost line L3 in the blanking aperture array 30 is turned on, the apertures of center line L2 and rows R1 and R3 are turned on, the apertures of rows R1, R2, R3 of the leftmost line L3 are turned on, and the other apertures are turned off. The deflection means 20 and 22, on the other hand, deflect and radiate the electron beam at position Q3 on the specimen 10. As a result, the electron beam that has passed through the aperture (L3, R2) is radiated again at position P1 of the specimen 10 exposed under the condition of FIGS. 3A and 3B. Further, the two electron beams that have passed through the apertures (L2, R1) and (L2, R3) are radiated at positions P2 and P3, respectively, on the specimen 10, and the three electron beams that have passed through the apertures (L1, R1), (L1, R2) and (L1, R3) are radiated newly at positions P4, P5, P6, respectively, on the specimen 10.

In this way, in the BAA exposure method, the exposure pattern and the deflection position in the blanking aperture array 30 are moved in synchronism with each other thereby to expose a point on the specimen a plurality of times with different apertures. In the BAA exposure method, the plotting speed can be increased by the number of the rows as compared with the single-stroke method. With a single-row blanking aperture array, the plotting speed can be increased by the number of rows in similar fashion. In the case of the single-line or single-row method involving a single stroke, all the apertures may turn from an off to an on state. Such an operation causes a defocusing in which the focal point of the electron beam is displaced. This phenomenon reduces the quality of the exposure pattern, and therefore the focusing point must be corrected. To obviate this inconvenience, though not shown in FIG. 1, a refocus coil is provided for adjusting the focal point. This method, however, is accompanied by such a sharp change that the correction is unavoidably delayed, thereby limiting the scanning rate and forming a stumbling block to an improved plotting speed.

With the BAA exposure method, in contrast, the proportion of the apertures turned from off to on state which represents of all the apertures is reduced to about one divided by the the number of lines. Therefore, the change in the correction amount of the focal point is reduced for an improved scanning speed.

The area exposed by an aperture in the BAA exposure method is 0.128 $\mu m \square$. As compared with the variable rectangle method of 3 $\mu m \square$, for example, the throughput of the wholly solid pattern is reduced for other than the BAA exposure method using about 550 or more beams. For realizing a practical high plotting speed, therefore, the number of the apertures is required to be at least 550, or preferably, not less than 1000.

FIG. 4 is a diagram showing an example of the blanking aperture array having 512 apertures, in which 64 rows are arranged in the direction perpendicular to the scanning direction and 8 lines along the scanning direction. In FIG. 4, numerals 30A1, 30A2, . . . , 30D2 designate the apertures for one line, respectively. Any aperture displaced by the length of a side of the aperture and arranged in staggered fashion is regarded as displaced in the X direction, in which case two lines so displaced are regarded as one line. The apertures 33 are formed on a thin board 31. A pair of a common electrode 34 and a blanking electrode 35 is formed on the board 31 for each aperture 33 thereby to control the deflection of the electron beam passed through the aperture 33. The pitch p in the X direction of the apertures 33 is three times as long as the length a of one side of the aperture 33, for example, in order to secure an area for the electrodes and wiring. The apertures 30A, 30C constituting a group of two lines are displaced by one half side of the aperture in the Y direction with respect to the aperture groups 30B, 30D. Further, the pitch in the X direction between the groups 30B and 30C is 3.5 times as long as the length of one side of the aperture 33. As a result, four beam groups are overlapped by one half for exposure. Therefore, the dimensional adjustment of a pattern edge and the high-accuracy correction of proximity effect become possible with a value smaller than the dot size. This will not be described in detail.

As described above, the moving stage 12, the main deflector 20 and the subdeflector 22 cover a range in the descending order of size that can be scanned with the required accuracy. The descending order of scanning speed is the reverse. In order to realize efficient scanning using this property, the scanning is effected as shown in FIG. 5.

FIG. 5 is a diagram for explaining the beam scanning in the charged particle beam exposure apparatus of FIG. 1.

The stage 12 is adapted to move continuously in the direction H2 regardless of the deflector. When the subfield E2 desired for exposure enters the deflectable range (setting) of the main deflector 20, the main deflector causes the stage 12 to jump to the central value thereof vectorially (moved in a zigzag in the scanning direction as shown).

A plurality of cell stripes E1 exist in the subfield for raster scanning and are scanned by the subdeflector 22.

The time during which one subfield is exposed is very short. The amount by which the stage has moved in the meantime is fed back to the subdeflector 22 in real time.

In exposing the next frame, the stage moves in the opposite direction, and so does the main deflector, in a zigzag.

In FIG. 5, the same pattern is exposed in the chip areas G1 to G11 on the semiconductor wafer 10. In such a manner the frames E4 in each chip are exposed sequentially in the direction of arrow, the moving stage 12 is moved and the exposure dot data for the frames E4 is used repetitively. The main control circuit 24 shown in FIG. 1 generates an on/off signal indicating whether a voltage is to be applied or not to the electrode of each blanking aperture in accordance with the movement of the exposure pattern, and a voltage signal is applied to each electrode through the driver of the BAA drive circuit 40.

As described above, a pair of the common electrode 34 and the blanking electrode 35 are formed for each aperture 33. For example, all the common electrodes 34 are connected to a power line of DC level such as the ground, and each blanking electrode 35 is supplied with a signal for turning on/off the electron beam passing through the particular aperture.

Figure 6:
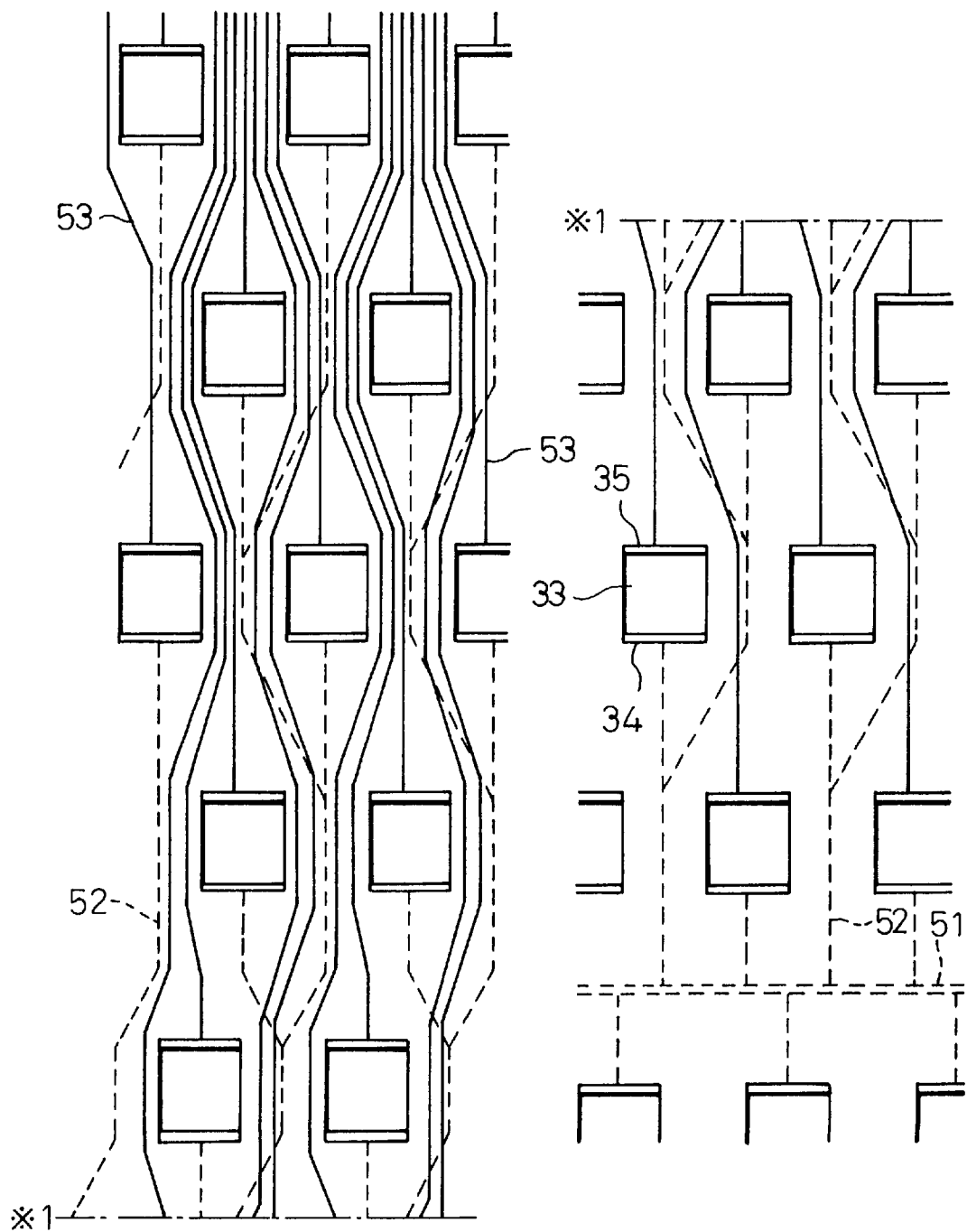
FIG. 6 is a diagram showing an example of wiring on a blanking aperture array board.

FIG. 6 is a diagram showing an example of wiring for BAA, as viewed from the back of the BAA. As shown, the wiring 53 to each blanking electrode 35 is arranged on the back, and the wiring 51, 52 to the common electrode 34 are arranged on the front side. In the BAA shown in FIG. 4, a power line 51 of DC level is arranged at the central portion between the groups 30B and 30C, and a wiring 52 is formed to each common electrode 34 from the power line 51. The wirings 53 to each blanking electrode 35, on the other hand, extend to the center from one peripheral side for the groups 30A and 30B, and to the center from the other peripheral side for the groups 30C and 30D.

The BAA is a chip formed into a thin board (membrane) by a semiconductor process. As shown in FIG. 7, electrode pads 54 are formed on the board, and the wiring to each blanking electrode 35 and the power line 51 of DC level is connected to each electrode pad. The wiring on the back side is connected to the electrode pads on the front side by through holes or the like. As described above, there are at least 500 apertures 33, and as many electrode pads, plus the number of the electrode pads connected to the power line 51 of DC level, are required.

FIG. 8 is a perspective view showing an example of transmission paths for supplying a drive signal for each aperture and power to the electrode pads 54 on the BAA board. The BAA board is fixedly held on a column 3 of the electron beam exposure apparatus, and the electron beam from an electron gun 1 is shaped by a shaping lens 2 and enters the blanking aperture array (BAA) of the BAA board. The board designated by reference numeral 61 is a probe card having a probe 64 adapted to contact the electrode pads of the BAA board. A hole sufficiently large, as compared with the diameter of the electron beam, is formed at the center of the board, and the probe 64 is arranged around the hole. As described above, the interior of the column 3 is evacuated, and a connecting board is used for wiring to the outside while maintaining the internal vacuum of the case 3. This connecting board is divided into four portions 67A to 67D, a connector inside each of the connecting boards 67A to 67D is connected to the connector of the probe card 61, and an outside connector is connected to each of the boards 62A to 62D carrying the BAA drive circuit 40. The portion of the connecting boards 67A to 67D defined by the wall of the column 3 includes means 66 such as a packing for holding the interior in a vacuum. In an alternative case, the probe card 61 and the connecting boards 67A to 67D are integrated with each other, the peripheral portion of the probe card 61 is divided into four segments, and a connector is arranged on each of the segments for connecting to the boards 62A to 62D carrying the BAA drive circuit 40.

The BAA control circuit 40 is dividedly arranged on the four boards 62A to 62D. In response to a signal supplied from the main control circuit 24 on the board 63, a voltage signal is generated to be applied to each blanking electrode of the BAA 30. The connecting boards 67A to 67D and the boards 62A to 62D are connected to each other by cables 65. The voltage signal generated in the BAA control circuit 40 is applied to each blanking electrode 35 of the BAA 30 through a signal transmission path including the cable 65, the wirings of the connecting boards 67A to 67D and the probe card 61, the probe 64 and the wiring of the BAA 30. The BAA drive circuit 40, which is a driver circuit and consumes considerable power, requires cooling means or the like. Also, the consumption of large power generates an electromagnetic wave. Therefore, the BAA drive circuit 40, if arranged in the vicinity of the electron beam exposure apparatus, adversely affects the exposure apparatus due to noise. Taking the requirement of cooling means and the noises into account, the boards 62A to 62D carrying the BAA drive circuit 40 are required to be arranged at a distance from the column 3.

FIGS. 9A and 9B are diagrams schematically showing the signal transmission path leading from the board 63 carrying the main control circuit 24 to the BAA board 30. As shown, the BAA board 30 and the probe card 61 are connected by the probe 64; the probe card 61 and the connecting board 67 (shown as a collection of the connecting boards 67a to 67d, as is the case with the boards 62) are connected by a pin 72 connecting the connector 71 of the probe card 61 and the connector 73 of the connecting board 67. The connecting board 67 and the board 62 carrying the BAA drive circuit 40 are connected by a cable 75 connecting the connector 74 of the connecting board 67 and the connector 76 of the board 62. The board 62 and the board 63 carrying the main control circuit 24 are connected by a cable 78 connecting the connector 77 of the board 62 and the connector 79 of the board 63.

The portion of the transmission path of the signal generated in the BAA drive circuit 40 up to an intermediate point of the connecting board 67 from the board 62 is located outside the column 3, and the portion from there up to the BAA 30 is located in the column 3.

In the case where the probe card 61 and the connecting boards 67A to 67D are integrated so that a portion of the probe card 61 extends outside of the column 3 as described above, the portion from the board 62 to an intermediate point of the probe card 61 is located outside the column 3 and the portion from there to the BAA 30 is located inside the column 3.

Figure 10:
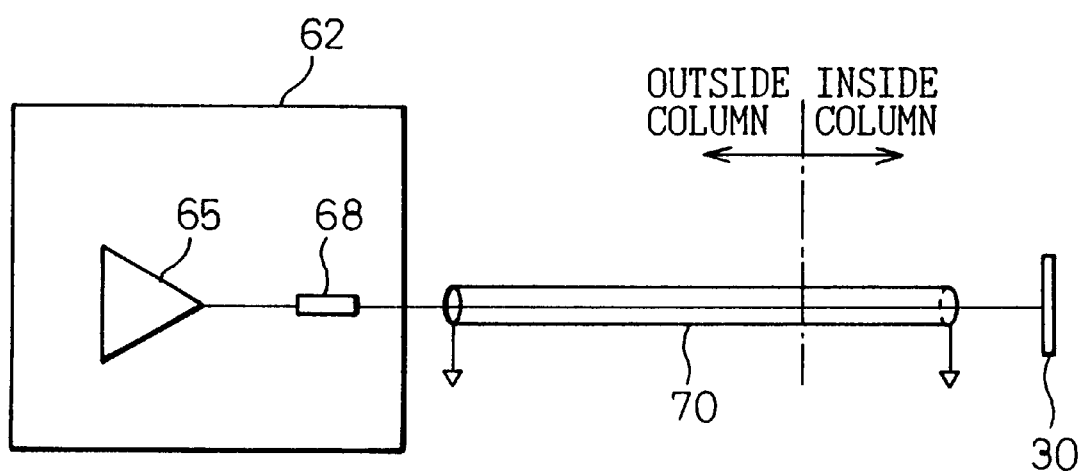
FIG. 10 is a diagram showing relative positions of a column and the signal transmission path leading from the BAA control circuit to the BAA blanking electrodes.

FIG. 10 is a diagram showing the signal transmission path from the board 62 to the BAA 30 in simplified fashion. The transmission path extends from a driver element 65 of the board 62 to the blanking electrode 35 of the BAA 30 through an output resistor 68 and a signal line 70. The coaxial cable or the like is used as the cable 75 making up the signal line 70, and further, the signal wiring of the probe card 61, the connecting board 67 and the board 62 is fabricated to a predetermined impedance. The signal transmission path is fabricated to have an impedance coinciding with the output impedance of the driver element 65, or specifically, the resistance value (say, 50 Ω) of the resistor 68.

The signal sent from the main control circuit 24 to the BAA control circuit 40 is a serial signal and it is converted into a parallel signal by a shift register or the like included in the BAA control circuit 40. Therefore, although a comparatively small number of signal lines can be inserted between the board 63 and the boards 62A to 62D, the signals applied to the blanking electrodes 35 of the BAA 30 are output in parallel from the BAA control circuit 40. Thus, signal transmission paths at least as many as the apertures are required from the boards 62A to 62D leading to the BAA 30. For example, as many as 500 or more signal transmission paths are required.

The foregoing description briefly refers to the conventional BAA exposure apparatus. This conventional BAA exposure apparatus has the problems that high-speed signal transmission is difficult through the signal transmission path leading from the BAA control circuit 40 to the blanking electrodes, that the signal transmission path to each blanking electrode is charged to a high voltage and develops a dielectric breakdown by the electron beam radiated, and that it is difficult to discover a defective point of the transmission path. The embodiments described below solve these problems.

Figure 11:
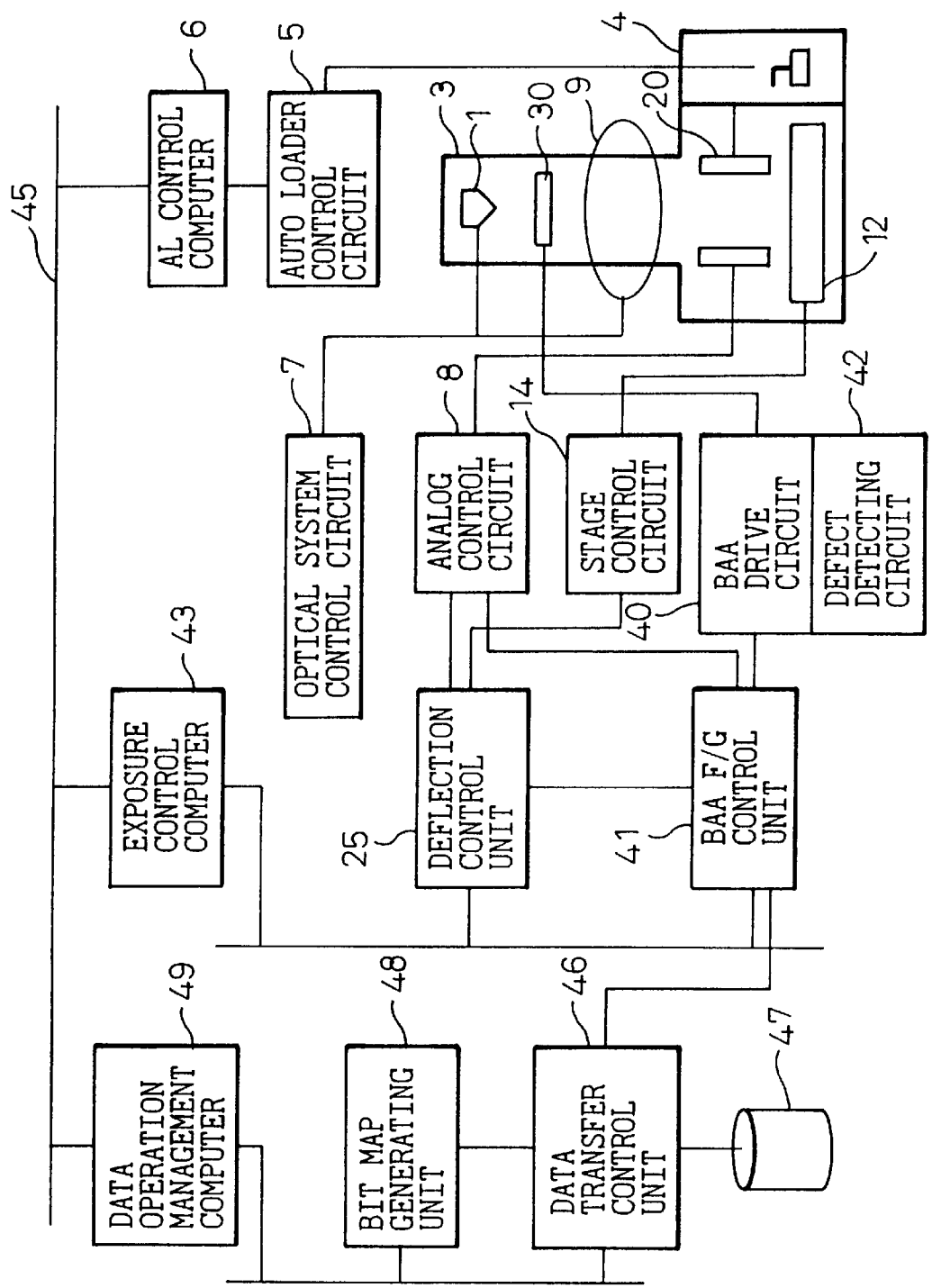
FIG. 11 is a block diagram showing a general configuration of an electron beam exposure apparatus according to an embodiment of the invention.

FIG. 11 is a block diagram showing a general configuration of the charged particle beam (electron beam) exposure apparatus according to an embodiment of the invention. As shown, this apparatus controls the whole operation with a data operation management computer 49 for managing the design data, an exposure control computer 43 for controlling the exposure operation of the apparatus and an auto loader (AL) control computer 6 for controlling the supply and delivery of the semiconductor wafers. These computers are connected to each other by a local area network (LAN) 45. Also, the data operation management computer 49 is connected through a bus to a bit map generating unit 48 and a data transfer control unit 46. The exposure control computer 43, on the other hand, is connected through a bus to a deflection control unit 25 and a BAA F/G control unit 41.

The pattern data produced from the design data are stored in a disk device (not shown). The data operation management computer 49 reads the pattern data stored in this disk device, and reads it into the data development section of the bit map generating unit 48 thereby to develop it into bit data. At the same time, refocus data are generated from the bit data for correcting the expansion or contraction of the focal point of the beam according to the number of the beams turned on.

The exposure control computer 43, the deflection control unit 25 and the BAA F/G control unit 41 realize the function corresponding to the main control circuit 24 of FIG. 1. The bit data thus developed are stored in an exclusive bit base disk 47 through the data transfer control unit 46 for each cell stripe or a plurality of cell stripes. These development work are performed before exposure operation. The exposure speed, therefore, has no effect on the development of the bit data. Also, the data, once developed, can be used again for exposing the same data, and therefore need not be redeveloped. For this purpose, the bit data already developed are held in the exclusive bit base disk 47. Further, the fact that the data are held makes it possible to verify a fault which may subsequently occur at the time of exposure.

The bit data held in the exclusive bit data base disk 47 are transferred to a high speed buffer arranged in the BAA F/G control unit 41 before starting the exposure operation. This high speed buffer has a capacity that can store data corresponding to about two 20-mm☐ chips and can be split into two portions in the case where the chip size to be exposed is smaller than 20 mm☐, so that data from one portion are stored and data from the other portion can be output at the same time. Thus, the data of the chip next to be exposed can be transferred during the exposure of the preceding chip. For a chip size larger than 20 mm☐, on the other hand, the whole memory capacity is used for the exposure of one chip.

The bit data output from the high speed buffer are subjected to parallel-serial conversion and, while being controlled in timing, are supplied to the BAA drive circuit 40. Thus a voltage signal applied to the electrode by the driver of the BAA drive circuit 40 is generated and applied to the signal transmission path leading to the BAA 30. Also, at the time of mark detection for improving the accuracy of the exposure pattern, the data for that purpose are applied to the signal transmission path.

After the stage begins to continuously move, the deflection control unit 25 outputs a signal indicating the deflection position of the main deflector and the subdeflector to an analog control circuit 8. In response to this signal, the deflection position of the main deflector and the subdeflector is determined, and the scanning of the subdeflector begins. At the same time, the deflection control unit 25 generates a signal for starting the cell stripe exposure described above. In response to this signal, the BAA F/G control unit 41 sends the bit data to the BAA drive circuit 40 thereby to turn on/off the BAA by one cell stripe. An optical system control circuit 7 is a component for generating a signal to be applied to a convergence lens 9 or the like.

The auto loader control circuit 5 is a component for automatically performing the process for exposing a plurality of semiconductor wafers. According to the control data sent from the AL control computer 6, the semiconductor wafers are taken out sequentially from the auto loader 4 and set in the stage 12, while the semiconductor wafers already exposed are returned to the auto loader 4.

A detailed operation of the above-mentioned components is the same as in the prior art described with reference to FIG. 1 and will not be described further.

Figure 12:
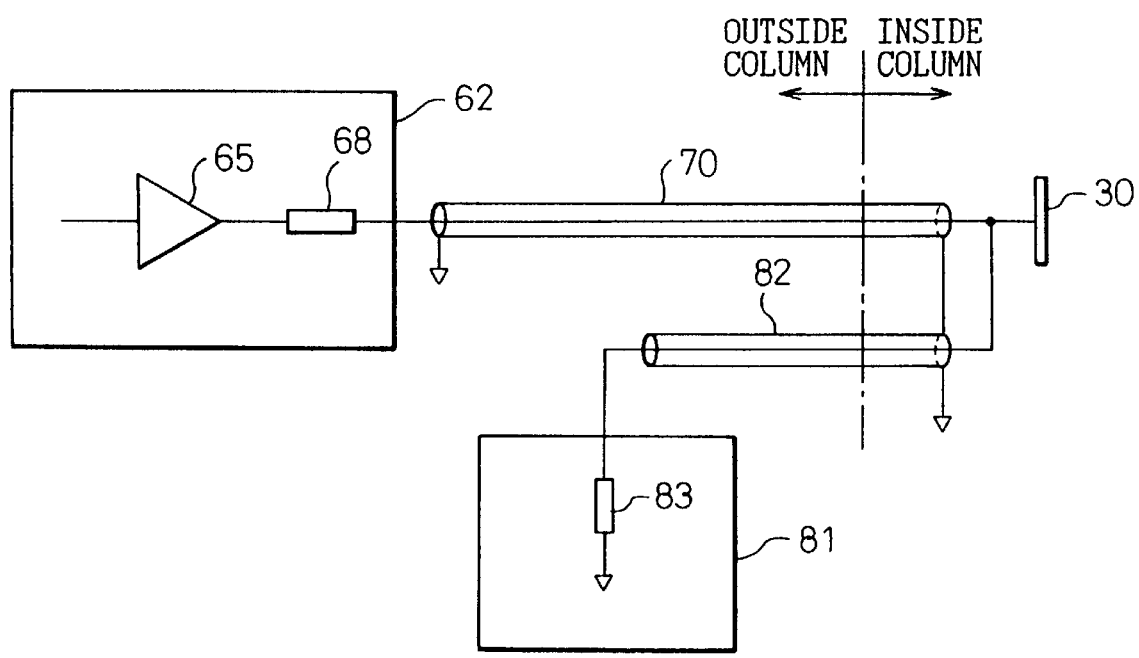
FIG. 12 is a diagram schematically showing a configuration of a signal transmission path leading from the BAA control circuit to the BAA blanking electrodes according to a first embodiment of the invention.

FIG. 12 is a schematic diagram showing a signal transmission path for applying a voltage signal to the blanking electrodes 35 of the BAA 30 in the BAA exposure apparatus according to the first embodiment of the invention. FIG. 12 corresponds to FIG. 10. In the apparatus of this embodiment, the probe card 61 is integrated with the connecting boards 67A to 67D so that part of the probe card 61 extends outside of the column 3. As is apparent from the comparison between FIGS. 12 and 10, according to this embodiment, as in the prior art, the voltage signal output from the driver 65 of the BAA control circuit 40 arranged on the board 62 is applied to the blanking electrodes 35 of the BAA 30 through an output resistor 68 and the signal transmission path 70 having a predetermined impedance. The output resistor 68 has a resistance value of 50 Ω, the cable connecting the probe card 61 and the board 62 has an impedance of 50 Ω, and the signal transmission path arranged on the board 62 and the probe card 61 also has an impedance of 50 Ω. According to this embodiment, the signal transmission path branches in the neighborhood of the probe 64 of the probe card 61, and is connected to an auxiliary resistor 83 of 50 Ω arranged on the board 81 through an auxiliary transmission path 82 of an impedance of 50 Ω extending outside of the column 3. The other end of the auxiliary resistor 83 is connected to the ground. The column 3 is used as the ground for the drive circuit of other components, and the other end of the auxiliary resistor 83 can be connected to the column 3. Specifically, the signal route leading from the driver 65 to the ground through the output resistor 68, the signal transmission paths 70, 82 and the auxiliary resistor 83 is matched to the impedance of 50 Ω, and does not reflect the signal midway. Therefore, the signal can be transmitted at high speed.

Figure 13:
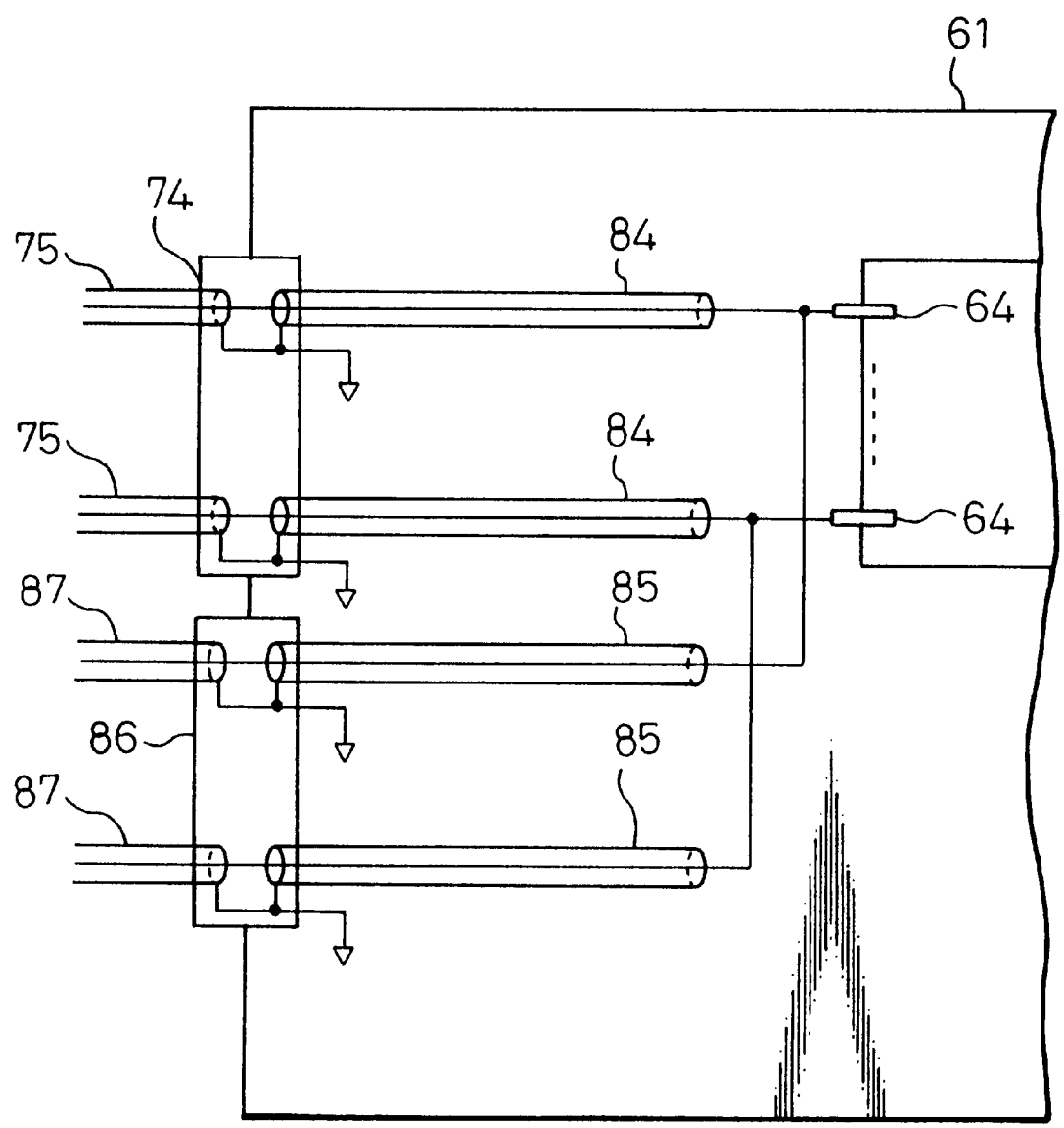
FIG. 13 is a diagram schematically showing a configuration of the signal transmission paths in a probe card according to the first embodiment.

FIG. 13 is a diagram showing the state of the signal transmission paths of the probe card 61. A cable 75 connected to the board 63 carrying the BAA control circuit 40 is connected to a signal transmission path 84 on the probe card 61 by a connector 74, and further to the probe 64. The probe 64 is in contact with the electrode pads 54 on the chip of the BAA 30, and the electrode pads 54 are connected to the blanking electrode 35 of each aperture. The signal transmission paths 84 branch to other signal transmission paths 85 arranged on the probe card 61 in the neighborhood of the probes 64. The signal transmission paths 85 are connected to cables 87 by a connector 86, and the cables 87 are connected to a board 81 having an auxiliary resistor 83.

Figure 14:
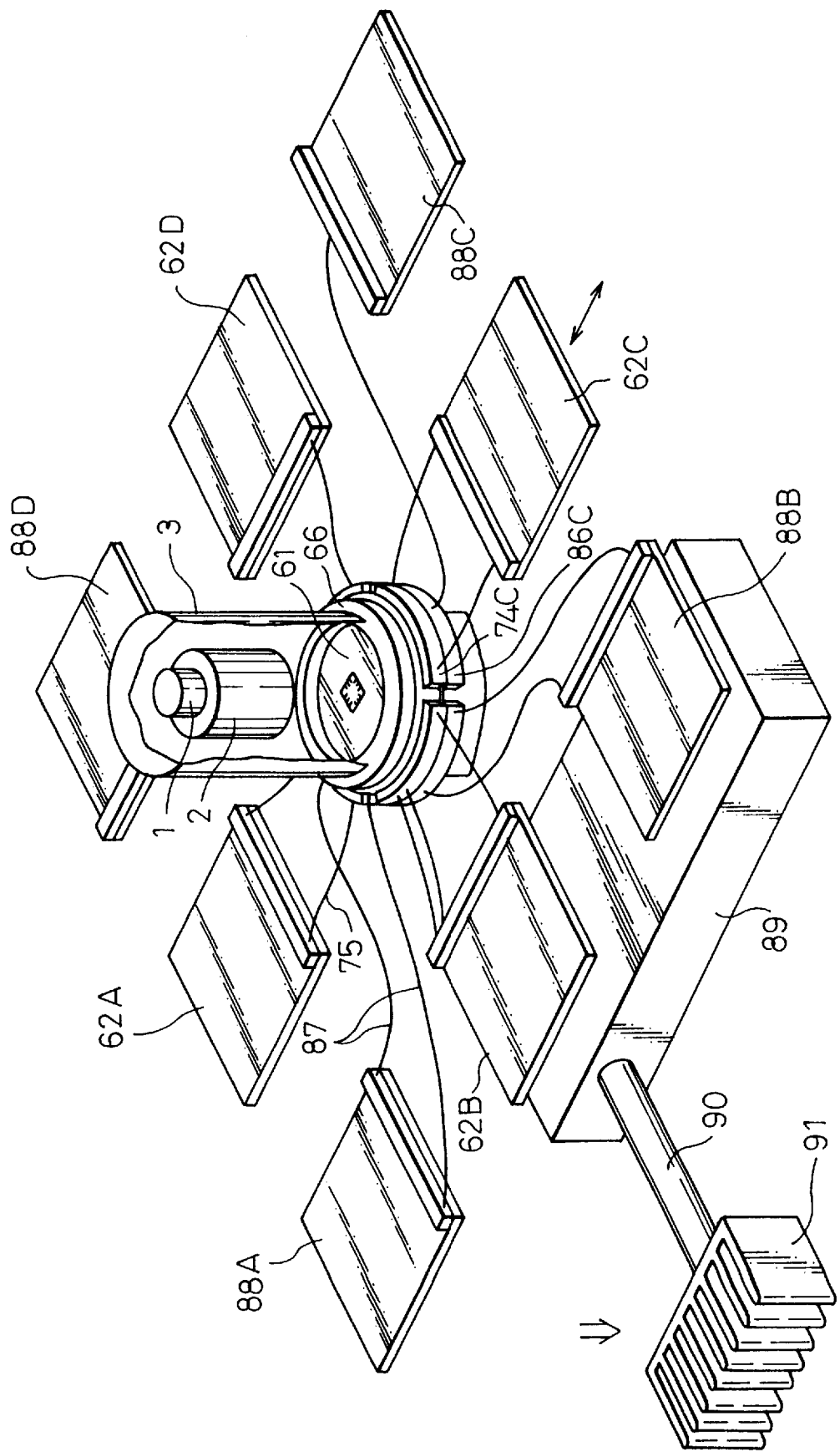
FIG. 14 is a perspective view showing the whole of an electron beam exposure apparatus according to the first embodiment of the invention.

FIG. 14 is a perspective view showing an example of the transmission paths for supplying a drive signal for each aperture to the electrode pads 54 of the BAA board according to the first embodiment, and corresponds to the prior art shown in FIG. 8. The board 63 having the main control circuit 24 is not shown. As is apparent from the comparison between FIGS. 8 and 14, the BAA exposure apparatus according to this embodiment comprises connectors 86A to 86D for the auxiliary transmission path in addition to the connectors 74A to 74D conventionally arranged around the probe card 61. The apparatus further comprises boards 88A to 88D on which the auxiliary resistor 83 is mounted in four blocks. The connectors 86A to 86D and the connectors of the boards 88A to 88D are connected to each other by coaxial cables 87.

Also, as shown, the heat of a cooling plate 89 is transferred to a radiator 91 by a heat pump 90. The cooling plate 89 is arranged in contact with the heating elements such as the resistors and the driver elements of the boards 62B and 88B, and functions to hold these elements at a predetermined temperature. Though not shown in FIG. 14, the set of the cooling plate, the heat pump and the radiator is arranged also for each of the boards sets 62A, 81A; 62C, 88C and 62D, 88D.

Assume, for example, that the output voltage of the driver 65 is 9 V and the resistance of the intermediate signal transmission path can be ignored. Since two resistors of 50 Ω are connected, a current of 90 mA flows. When the driver 70 continuously outputs 9 V, therefore, the heat generated in the output resistor 68 and the auxiliary resistor 83 are 0.4 W, respectively. Assuming that there are 500 signal transmission paths, the total heat generated is 400 W, with each of the boards 88A to 88D generating the heat of 50 W. Even more heat is generated in the boards 62A to 62D because the heat generated in the driver 70, etc. is added thereto. In the case where such a large heat source is arranged in the neighborhood of the BAA exposure apparatus, the temperature of the electromagnetic lens and the deflectors (main deflector and subdeflector) arranged in the column 3 also changes and the characteristics thereof undergo a delicate change, resulting in a deteriorated plotting accuracy. For this reason, the boards 62A to 62D and 88A to 88D are desirably cooled and maintained at a predetermined temperature.

As described above, in the BAA exposure apparatus according to this embodiment, the impedance of the signal transmission paths leading from the driver 65 of the BAA control circuit 40 to the blanking electrodes 35 of the BAA 30 is matched, and therefore no signal reflection occurs. The reflected wave, if any, can be extinguished in the signal applied to the BAA blanking electrodes. Even when the driver 70 is operated at a higher speed, therefore, the voltage signal is accurately applied to the blanking electrodes 35 of the BAA 30. Thus, the on/off control of each electron beam can be performed at high speed by the deflection of the BAA 30, thereby making possible a high-speed plotting. According to the first embodiment, the signal transmission path branches midway in the neighborhood of the probe 64. Ideally, however, the signal transmission path desirably branches at the blanking electrodes as described with reference to the second embodiment. In the case where the branching point is located in the neighborhood of the transmission path leading to the blanking electrodes as in the first embodiment, however, an arrangement can be made to substantially distinguish the reflected wave also in the signal route leading from the branching point to the BAA blanking electrodes.

As described above, a considerable amount of heat is generated in a resistor. Since as many resistors as the signal transmission paths are required, a large amount of heat is generated in the board 62 (actually, 62A to 62D) and the board 88 (actually, 88A to 88D). The resistor is heated when the driver 65 outputs a high voltage for turning off the electron beam passing through a corresponding aperture. Thus the generated heat amount varies with the number of electron beams turned off. As described above, the BAA exposure apparatus is liable to be affected by the temperature change. Even a temperature change of about 0.5° around the column 3, for example, affects the plotting accuracy. However, the boards 88A to 88D, though arranged at a distance from the column 3 for the reason mentioned above, cannot be located excessively far from the column 3 to prevent the transmission rate from decreasing. This gives rise to the problem of the effect of the heat generated in the resistor or the like. According to the first embodiment, therefore, the temperature of the boards is held at a constant level by use of the cooling means including the cooling plate, the heat pump and the radiator shown in FIG. 14.

As long as the boards generate a constant amount of heat, the temperature can be maintained at a constant level with comparative ease by feedback control of the cooling means. When the generated heat amount fluctuates, however, the time lag of the temperature control causes a temperature fluctuation in the short term, although a comparatively constant temperature is held on the average in the long term. The problem of the BAA exposure apparatus is the temperature change in the short term. The second embodiment is intended to solve this problem.

Figure 15:
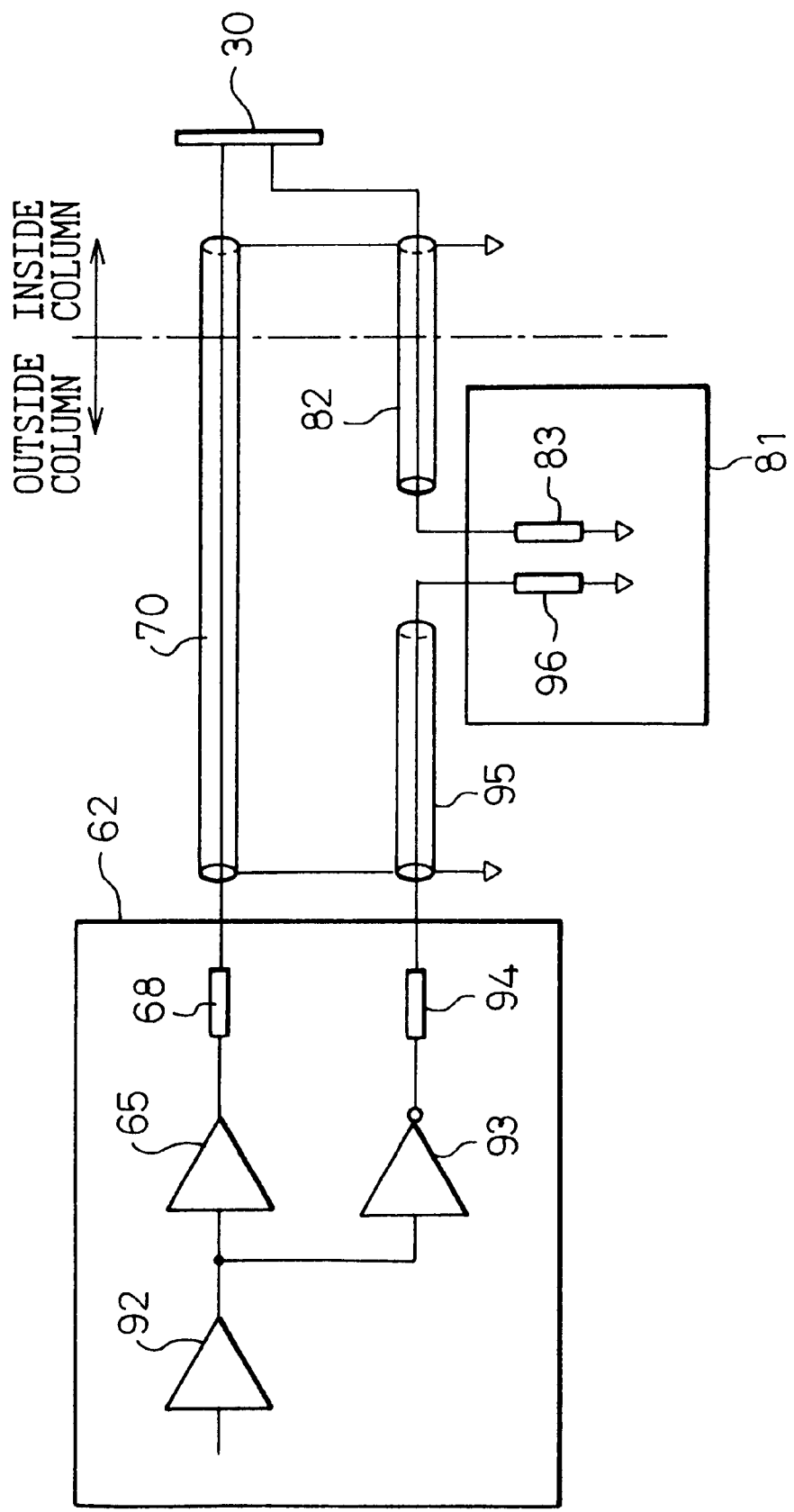
FIG. 15 is a schematic diagram showing a configuration of a signal transmission path leading from the BAA control circuit to the BAA blanking electrodes according to a second embodiment of the invention.

FIG. 15 is a diagram schematically showing a signal transmission path for applying a voltage signal to the blanking electrodes 35 of the BAA 30 in the BAA exposure apparatus according to the second embodiment of the invention, and corresponds to FIGS. 10 and 12. As apparent from the comparison with FIG. 12, this embodiment, in addition to the configuration of the first embodiment, comprises a dummy driver 93 and a dummy output resistor 94 for outputting a signal inconsistent with the output of the driver 65 to the board 62, a dummy resistor 96 arranged on the board 81 and a dummy transmission path 95 for applying to the dummy resistor 96 the output signal of the dummy driver 93 output through the dummy output resistor 94. The dummy resistor 96, which is the same as the resistor 83 and has the same impedance of 50 Ω as the latter, has the other end thereof connected to the ground. This dummy resistor 96 is housed together with the resistor 83 in a single case made of a heat conductive material. Thus, the dummy resistor 96 is thermally coupled with the resistor 83. The dummy driver 93 has the same characteristics as the driver 65 except that the former outputs an inverted signal. The dummy output resistor 94 also is the same as the output resistor 68 and has an impedance of 50 Ω. Further, the dummy transmission path 95, like the signal transmission path 70, has a transmission impedance of 50 Ω.

Further, the output resistor 68 is also thermally coupled with the dummy output resistor 94.

Also, the auxiliary transmission path 82 starts with the blanking electrodes 35 of the BAA 30, leads outside of the column 3 through a wiring newly arranged on the BAA 30, electrode pads and the signal transmission path arranged on the probe card, and is connected to the board 81 through the coaxial cable 87.

In the apparatus of the second embodiment, the output resistor 68 is thermally coupled with the dummy output resistor 94, and so is the dummy resistor 96 with the resistor 83. As described above, the driver 65 and the dummy driver 93 output inverted signals. Therefore, when one of the output resistor 68 and the dummy output resistor 94 and one of the dummy resistor 96 and the resistor 83 are heated, respectively, the other of each couple generates no heat. Therefore, the total amount of heat generated by the output resistor 68 and the dummy output resistor 94 is constant, and so is the total amount of heat generated by the dummy resistor 96 and the resistor 83. The total amount of heat generated by all the resistors, therefore, is constant. As a result, by feedback control of the cooling means including the cooling plate, the heat pump and the radiator, a constant temperature can be accurately maintained and the plotting accuracy is not reduced.

Now, a third embodiment of the invention will be explained. According to the third embodiment, the signal transmission path leading from the BAA drive circuit 40 to the BAA board 30 is different from the corresponding part of the prior art and, as shown in FIG. 11, a defect detecting circuit 42 is provided in association with the BAA drive circuit 40. The apparatus according to the third embodiment further includes a connecting board 67.

Figure 16:
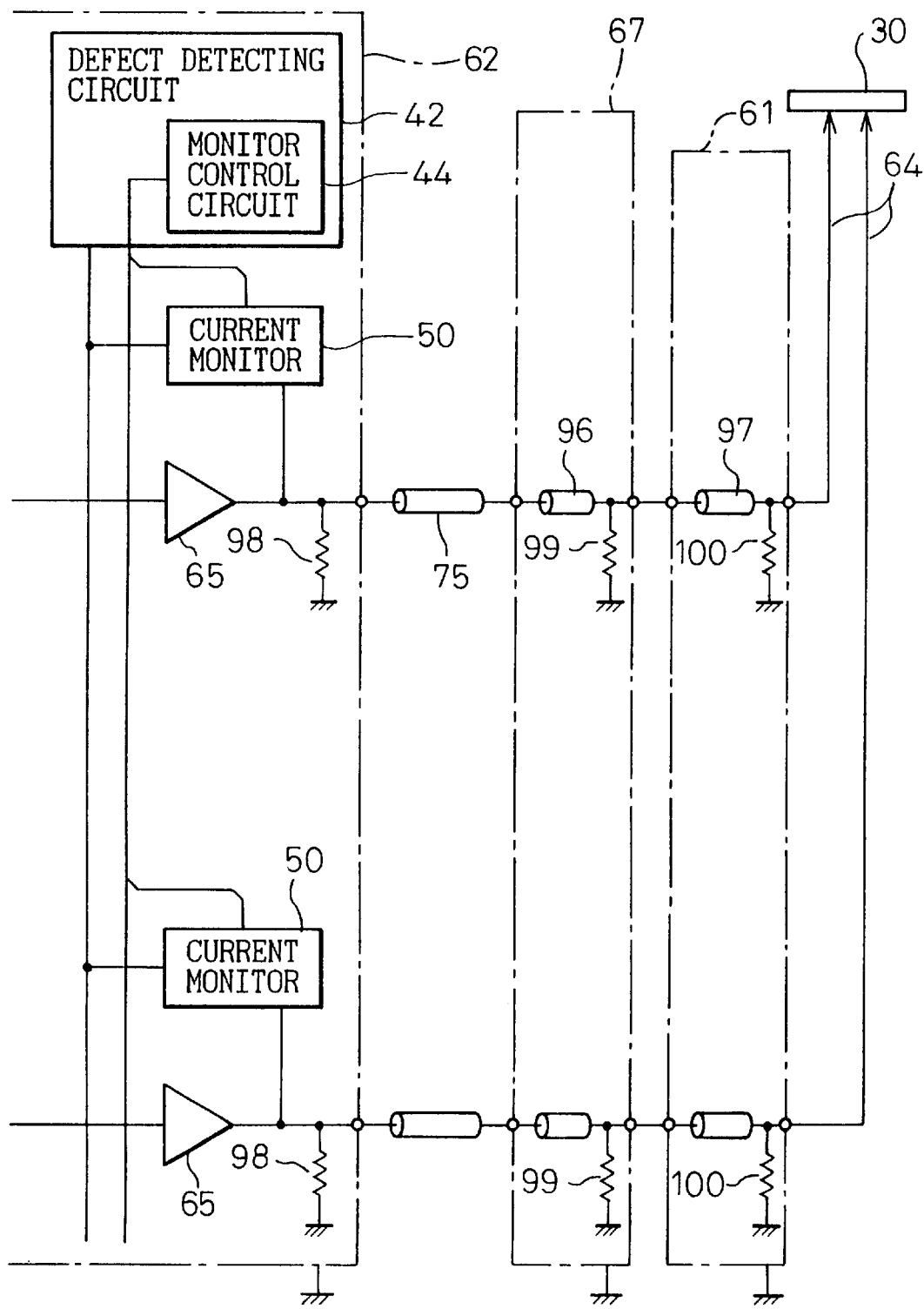
FIG. 16 is a schematic diagram showing a configuration of the signal transmission paths leading from the BAA control circuit to the BAA blanking electrodes according to a third embodiment of the invention.

FIG. 16 is a diagram showing a configuration of the signal transmission path leading from the BAA drive circuit 40 to the BAA board 30 according to the third embodiment. As described above, this signal transmission path leads from the driver 65 of the BAA drive circuit 40 arranged on the board 62 to a blanking electrode through the cable 75, the wiring 96 of the connecting board 67, the connectors 73, 72, 71, the wiring 97 of the probe card 61, the probe 64, an electrode pad 54 of the BAA board 30 and the wiring of the BAA board 30. As many signal transmission paths of this type as there are BAA apertures are provided. In other words, at least 500 signal transmission paths of this type are provided. On the board 62, a resistor 98 is inserted between the signal transmission path and the ground in the neighborhood of the connector 76. On the connecting board 67, a resistor 99 is inserted between the signal transmission path and the ground in the neighborhood of the connector 73. On the probe card 61, on the other hand, a resistor 100 is inserted between the signal transmission path and the ground in the neighborhood of the probe 64. The grounds of the boards are connected to each other and connected to the ground of the apparatus through a route not shown.

As shown in FIG. 16, in the electron beam exposure apparatus according to the third embodiment, when no voltage is applied by the driver 65, the blanking electrode 35 of BAA and the wiring portion leading thereto are irradiated with an electron beam. Therefore the signal transmission path is charged with a load thereby to generate a voltage. Since this voltage escapes into the ground by way of the resistors 98 to 100, however, the signal transmission path is not subjected to dielectric breakdown nor can the driver 65 run out of order unlike in the prior art.

Also, on the board 62, the output portion of each driver 65 is provided with a current monitor 50 for detecting the current supplied to the signal transmission path by the driver 65. The board 62 further includes a defect detecting circuit 42. The defect detecting circuit 42 includes a monitor control circuit 44 for outputting a signal for activating the current monitors 50 sequentially. The current monitor activated by the signal of the monitor control circuit 44 detects the current in the transmission path. Thus, the current monitors sequentially check whether the detected values are equal to a predetermined value. A current is generated in the signal transmission path by the radiation of the electron beam, and when detecting a current value, the electron beam is not desirably radiated.

Assuming that the resistors 100, 99, 98 are arranged on the boards 61, 67, 62, respectively, as shown in FIG. 16, when the signal transmission path is normal and not disconnected, the current Imon detected by the current monitor 50 is given as $$Imon=Vdrv(R1*R2+R2*R3+R3*R1)/(R1*R2*R3) \qquad (1)$$

where Vdrv is the output voltage of the driver 65, and R1, R2 and R3 the resistance values of the resistors 98, 99 and 100, respectively. It follows, therefore, that as long as this current is detected, the signal transmission path is normal. If a current is detected with the electron beam radiated, a current due to the electron beam is added to the above equation. The resulting change in current is substantially constant, and the current due to the driver can be detected by subtracting the current due to the electron beam from the detected current value. To assure the detection accuracy, however, it is desirable not to radiate the electron beam when detecting the current value.

Now, assume that the signal transmission path opens between the connecting points of the resistors R1 and R2 for some reason. The current value Imon detected by the current monitor is given as $$Imon=Vdrv/R1 \qquad (2)$$

If the transmission path opens between the connecting points of the resistors R2 and R3, on the other hand, the current value Imon is given as $$Imon=Vdrv*R1*R2/(R1+R2) \qquad (3)$$

If the transmission path opens between the connecting point of the resistor R3 and the blanking electrode 35 of the BAA board 30, the current Imon assumes the same value as in equation (1).

By accurately detecting the current value by the current monitor 50, therefore, the portion which is open can be estimated.

The resistance values R1, R2, R3 of the resistors 98, 99, 100 are determined taking the driving power of the driver 65 into account and may be several KΩ.

The detection of a defect during the exposure operation is required. If the electron beam is radiated when detecting the current value as described above, however, the detection accuracy of the current value correspondingly decreases. In view of this, during the exposure operation, the defect detecting circuit 42 activates the monitor control circuits 44 sequentially, and reads the current value detected by each current monitor 50 at the same time that the driver 65 of the corresponding channel turns on. Thus, the difference, if any, in the current values between the channels is detected. In the case where a channel having a difference is discovered, a defect may have occurred. The exposure control computer 43 is required to stop the exposure, and the radiation of the electron beam is stopped. Then, the value of the current monitor 82 of the particular channel is read and an accurate current value is detected, thereby checking whether or not a defect has occurred and checking for a defective point. In this way, by comparison with the current value of other channels, the effect of the electron beam radiation is canceled and accurate detection of a defect is made possible.

As described above, by connecting a plurality of resistors and detecting the current value accurately, a point where the signal transmission path is open can be identified. In some cases, however, the transmission path may open as a result of a resistor being broken due to a high voltage. In view of this, the withstanding voltages of the resistors are differentiated, so that should a high voltage be applied to the transmission path, a given resistor is easily broken and thus functions as a protective circuit. By doing so, a defective point can be easily identified. Also, a resistor which is shorted upon application of a high voltage thereto can be used as a protective circuit. Nevertheless, once a resistor is shorted, the voltage output from the driver fails to be applied to the corresponding blanking electrode.

Further, the current value changes in the same manner as when the resistor opens, and therefore it is difficult to determine whether the signal path has opened or the resistor has opened. In the case where the resistor 10 has opened, for example, the same current value Imon as shown in equation (3) above is detected. Thus, it cannot be determined whether the signal transmission path between boards has opened or the resistor 100 has opened.

In the case where the resistor 99 has opened, however, the current value Imon is given as $$Imon = Vdrv * R2 * R3(R1+R3) \quad (4)$$

If the resistor 98 has opened, on the other hand, the current value Imon is given as $$Imon = Vdrv * R2 * R3/(R2+R3) \quad (5)$$

By setting the resistors R1, R2, R3 to appropriate different values, therefore, it is possible to determine where the signal transmission path is open or which resistor is open, except whether the resistor 100 is open or the path between the boards 61 and 67 is open.

Figure 17:
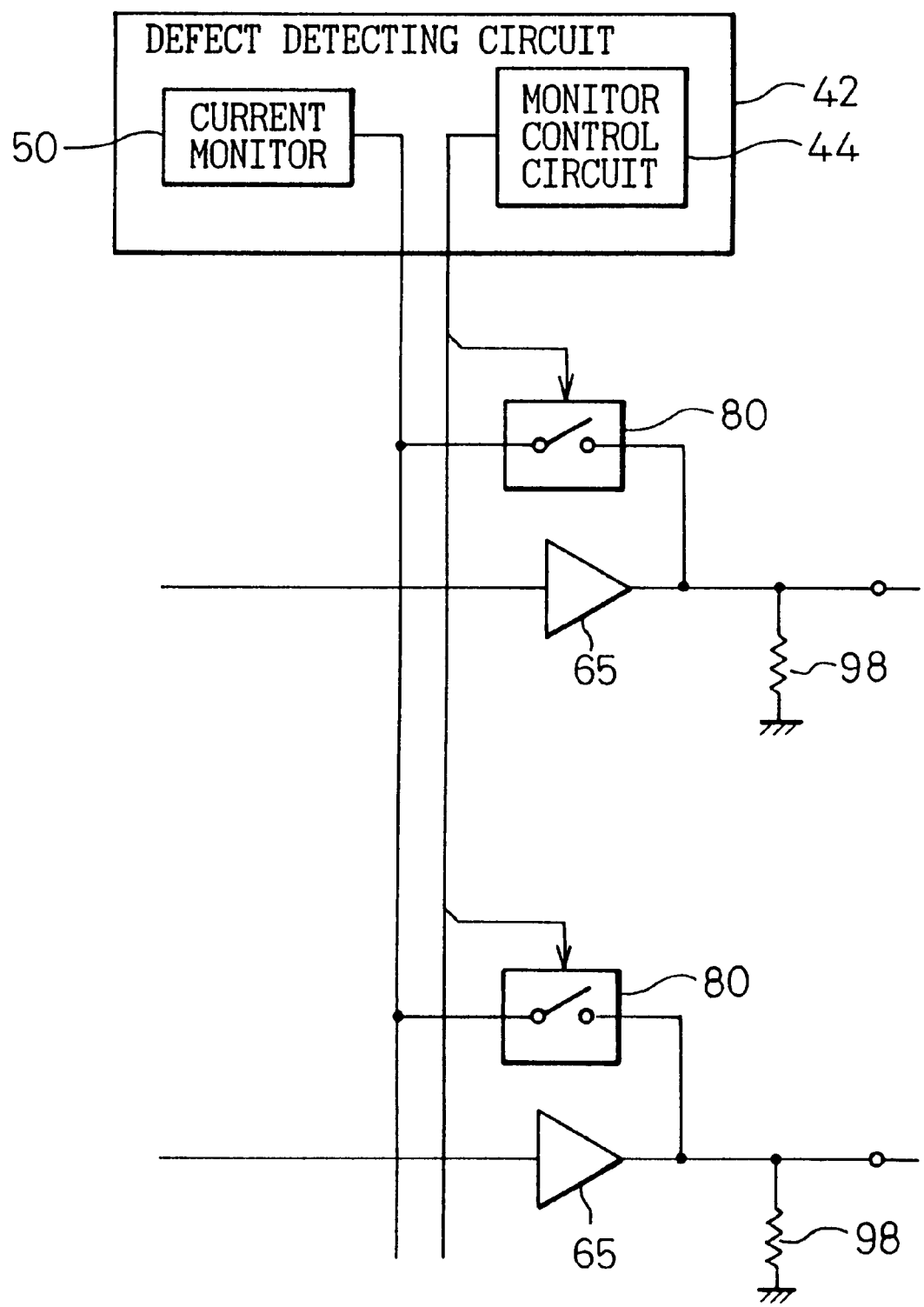
FIG. 17 is a diagram showing a configuration of a modification of the portion of a signal transmission path where a current and a defect are detected according to the third embodiment.

In the configuration of FIG. 16, the current monitor 82 is provided for each signal transmission path, and the defect detecting circuit 42 sequentially activates the current monitors 45 in response to the signal of the monitor control circuit 44 and reads the current values for the channels sequentially. This configuration, however, requires the current monitor 50 for each channel. To solve this inconvenience, as shown in FIG. 17, the current monitor 50 is included only in the defect detecting circuit 42, and a relay is provided for connecting each signal transmission path to the current monitor 50, and the monitor control circuit 44 controls so that the relays 80 are connected to the current monitor 50 sequentially thereby to detect the current in each signal transmission path. By doing so, the current monitor can be shared. Also, the signal transmission paths are divided into a plurality of groups, for each of which a current monitor may be provided.

In the foregoing description of embodiments, the resistance of the signal transmission path is sufficiently small. In the case where the resistance of the signal transmission path is large to a not negligible degree, however, a resistance value corresponding to the length of the signal transmission path is added to the above-mentioned equation of the current value.

As described above, according to this invention, there is provided a charged particle (electron) beam exposure apparatus having a blanking aperture array (BAA), wherein the transmission rate of the signal transmission path for applying a voltage signal to the BAA blanking electrodes is increased, and therefore the plotting speed can be improved by increasing the driving rate of BAA for an improved throughput of the apparatus. Also, the thermal stability is improved in the system for applying a voltage signal to the BAA blanking electrodes, and therefore stable, high-accuracy plotting is made possible.

Further, in a charged particle beam exposure apparatus of blanking aperture array (BAA) type according to this invention, a defect of the BAA blanking electrode can be detected for each control channel at high speed, so that the reliability of a multiplicity of beams which has hitherto been the problem of the BAA method can be easily guaranteed. Furthermore, since the system for defect detection is enclosed in the control channel, independent measurement by unit is possible with a simple configuration. Thus, an apparatus with high accuracy, high throughput and high reliability is easily realized.

What is claimed is:

1. A charged particle beam exposure apparatus for forming a predetermined exposure pattern on a specimen using a charged particle beam, comprising:

a column with the interior thereof held in vacuum;

charged particle beam generating means arranged in said column for generating a charged particle beam;

a blanking aperture array arranged in a light path of the charged particle beam from said charged particle beam generating means in said column, and including a plurality of apertures for shaping said charged particle beam and two-dimensionally arranged electrode sets arranged around each of said apertures, said charged particle beam being shaped according to whether a voltage signal is applied to each electrode or not;

a blanking aperture array control circuit arranged outside said column for outputting a voltage signal to be applied to the electrodes of each aperture according to said exposure pattern; and a plurality of blanking aperture signal transmission paths each including a plurality of channels for applying said voltage signal output from said blanking aperture array control circuit to the electrode of each aperture, and extending from outside said column into said column;

wherein output impedance of said blanking aperture array control circuit substantially coincides with a first transmission impedance of said blanking aperture signal transmission paths;

said apparatus further comprising an auxiliary transmission path including a plurality of channels extending from said electrode of each of said apertures to outside of said column, having a transmission impedance substantially coinciding with said first transmission impedance, and terminating with an impedance substantially coinciding with said transmission impedance.

2. A charged particle beam exposure apparatus according to claim 1, wherein said auxiliary transmission path includes, at the terminal thereof, a resistor having an impedance substantially coinciding with said transmission impedance.

3. A charged particle beam exposure apparatus according to claim 2, further comprising:
   a dummy driver for outputting a signal inverted from an output of said blanking aperture array control circuit;
   a dummy resistor arranged in a neighborhood of said resistor; and
   a dummy transmission path including a plurality of channels for applying the voltage signal output from said dummy driver to said dummy resistor.

4. A charged particle beam exposure apparatus according to claim 3,
   wherein said resistor and said dummy resistor are thermally coupled to each other.

5. A charged particle beam exposure apparatus according to claim 3,
   wherein said dummy driver has an output impedance substantially coinciding with that of said blanking aperture array control circuit, and
   wherein said dummy transmission path has a transmission impedance substantially coinciding with said first transmission impedance.

6. A charged particle beam exposure apparatus according to claim 3,
   wherein said dummy resistor has an impedance substantially coinciding with the impedance of said resistor.

7. A charged particle beam exposure apparatus according to claim 3,
   wherein said blanking aperture array control circuit has a driver and an output resistor,
   the apparatus further comprising a dummy output resistor connected to an output of said dummy driver,
   said output resistor and said dummy output resistor being thermally coupled to each other.

8. A charged particle beam exposure apparatus according to claim 2,
   wherein said resistor is arranged at such a position distant from said column where heat generated by said resistor has no thermal effect on interior of said column.

9. A charged particle beam exposure apparatus according to claim 2, further comprising cooling means for cooling said resistor.

10. A charged particle beam exposure apparatus according to claim 1,
    wherein said auxiliary transmission path terminates with said column.

11. A charged particle beam exposure apparatus for forming a predetermined exposure pattern on a specimen using a charged particle beam, comprising:
    charged particle beam generating means for generating a charged particle beam;
    a blanking aperture array arranged in a light path of the charged particle beam generated by said charged particle beam generating means and including a plurality of apertures for shaping said charged particle beam and a plurality of two-dimensionally arranged electrode sets around each of said apertures, said charged particle beam being shaped accordingly to whether a voltage signal is applied to each of said electrodes or not;
    a blanking aperture array drive circuit for outputting a voltage signal to be applied to each of said electrodes of each of said apertures in accordance with said exposure pattern; and
    a resistor interposed between a power path of a predetermined DC level and a blanking aperture signal transmission path including a plurality of channels for applying said voltage signal output from said blanking aperture array drive circuit to each of said electrodes of each aperture.

12. A charged particle beam exposure apparatus according to claim 11,
    wherein resistance value of said resistor is determined by potential generated in said blanking aperture signal transmission path one by said charged particle beam radiated on a part of said blanking aperture signal transmission path and an electrode and by a breakdown voltage around said blanking aperture signal transmission path.

13. A charged particle beam exposure apparatus according to claim 11,
    wherein said resistor is opened or shorted at a potential lower than a potential at which dielectric breakdown occurs, in accordance with a breakdown voltage around said blanking aperture signal transmission path.

14. A charged particle beam exposure apparatus according to claim 11, further comprising a current monitor for detecting current flowing in said blanking aperture signal transmission path.

15. A charged particle beam exposure apparatus according to claim 14, comprising a plurality of resistors arranged at different points of said blanking aperture signal transmission path.

16. A charged particle beam exposure apparatus according to claim 15,
    wherein said blanking aperture signal transmission path includes a signal wiring arranged on each of a plurality of boards and connecting means for connecting said signal wiring between said boards.

17. A charged particle beam exposure apparatus according to claim 16,
    wherein at least some of said resistors have different resistance values.

18. A charged particle beam exposure apparatus according to claim 15,
    wherein at least some of said resistors have different resistance values.

19. A charged particle beam exposure apparatus according to claim 15, further comprising a defect detecting circuit for detecting a position where said blanking aperture signal transmission path has opened, based on a current value detected by said current monitor.

20. A charged particle beam exposure apparatus according to claim 14,
    wherein said current monitor is arranged for said blanking aperture signal transmission path.

21. A charged particle beam exposure apparatus according to claim 14,
    wherein said current monitor is arranged for each set of a plurality of blanking aperture signal transmission paths;
    said apparatus further comprising a relay arranged for each of said blanking aperture signal transmission paths for connecting said blanking aperture signal transmission paths selectively to said current monitor.

22. A charged particle beam exposure apparatus according to claim 14, further comprising a defect detecting circuit for chronologically scanning and detecting at any time current value detected by said current monitor, and when the detected current value is different from a predetermined value, producing a signal indicating the occurrence of a defect and each plurality of the channels that has developed the defect.

* * * * *